United States Patent
Shehata et al.

(10) Patent No.: US 11,527,992 B2
(45) Date of Patent: Dec. 13, 2022

(54) ROTARY TRAVELING WAVE OSCILLATORS WITH DISTRIBUTED STUBS

(71) Applicant: Analog Devices International Unlimited Company, County Limerick (IE)

(72) Inventors: Mohamed A. Shehata, Limerick (IE); Michael F. Keaveney, Lisnagry (IE)

(73) Assignee: Analog Devices International Unlimited Company, Limerick (IE)

( * ) Notice: Subject to any disclaimer, the term of this patent is extended or adjusted under 35 U.S.C. 154(b) by 397 days.

(21) Appl. No.: 16/947,188

(22) Filed: Jul. 22, 2020

(65) Prior Publication Data

US 2021/0091721 A1 Mar. 25, 2021

Related U.S. Application Data

(60) Provisional application No. 62/902,753, filed on Sep. 19, 2019.

(51) Int. Cl.
*H03B 5/18* (2006.01)

(52) U.S. Cl.
CPC ..... *H03B 5/1852* (2013.01); *H03B 2200/0016* (2013.01); *H03B 2201/0208* (2013.01)

(58) Field of Classification Search
CPC .......... H03B 5/1852; H03B 2200/0016; H03B 2201/0208
See application file for complete search history.

(56) References Cited

U.S. PATENT DOCUMENTS

| | | | |
|---|---|---|---|
| 3,516,021 | A | 6/1970 | Kohn |
| 3,538,450 | A | 11/1970 | Andrea et al. |
| 4,246,550 | A | 1/1981 | Cohen |
| 4,246,555 | A | 1/1981 | Williams |
| 4,514,707 | A | 4/1985 | Dydyk et al. |

(Continued)

FOREIGN PATENT DOCUMENTS

| | | |
|---|---|---|
| CN | 102624334 A | 8/2012 |
| CN | 102104363 B | 1/2013 |

(Continued)

OTHER PUBLICATIONS

Abbasaozadeh, Soolmaz, "Thermal and flicker phase noise analysis in rotary traveling-wave oscillator," International Journal of Circuit Theory and Applcations, Jul. 2019.

(Continued)

*Primary Examiner* — Jeffrey M Shin
(74) *Attorney, Agent, or Firm* — Knobbe, Martens, Olson & Bear, LLP

(57) ABSTRACT

Rotary traveling wave oscillators (RTWOs) with distributed stubs are provided. In certain embodiments, an RTWO includes segments that are implemented using distributed stubs to mitigate flicker noise upconversion arising from transmission line dispersion. For example, a distance between the distributed stubs can be selected to intentionally generate a phase difference between transmission line modes, thereby cancelling out phase shifts due to transmission line dispersion. In particular, each segment is subdivided into multiple transmission line sections with a maintaining amplifier electrically connected to one of the sections and a tuning capacitor array connected to adjacent transmission line sections.

20 Claims, 13 Drawing Sheets

(56) References Cited

U.S. PATENT DOCUMENTS

| | | |
|---|---|---|
| 4,686,407 A | 8/1987 | Ceperley |
| 4,749,963 A | 6/1988 | Makimoto et al. |
| 4,875,046 A | 10/1989 | Lewyn |
| 5,117,206 A | 5/1992 | Imamura |
| 5,235,335 A | 8/1993 | Hester et al. |
| 5,302,920 A | 4/1994 | Bitting |
| 5,361,277 A | 11/1994 | Grover |
| 5,493,715 A | 2/1996 | Humphreys et al. |
| 5,546,023 A | 8/1996 | Borkar et al. |
| 5,584,067 A | 12/1996 | Buer et al. |
| 5,592,126 A | 1/1997 | Boudewijns et al. |
| 5,640,112 A | 6/1997 | Goto et al. |
| 5,652,549 A | 7/1997 | Unterricker et al. |
| 5,754,833 A | 5/1998 | Singh et al. |
| 5,825,211 A | 10/1998 | Smith et al. |
| 5,945,847 A | 8/1999 | Ransijn |
| 5,963,086 A | 10/1999 | Hall |
| 5,973,633 A | 10/1999 | Hester |
| 6,002,274 A | 12/1999 | Smith et al. |
| 6,078,202 A | 6/2000 | Tomatsuri et al. |
| 6,133,798 A | 10/2000 | Nagano et al. |
| 6,150,886 A | 11/2000 | Shimomura |
| 6,157,037 A | 12/2000 | Danielson |
| 6,239,663 B1 | 5/2001 | Mizutani |
| 6,249,189 B1 | 6/2001 | Wu et al. |
| 6,259,327 B1 | 7/2001 | Balistreri et al. |
| 6,259,747 B1 | 7/2001 | Gustafsson et al. |
| 6,281,759 B1 | 8/2001 | Coffey |
| 6,323,737 B1 | 11/2001 | Broekaert |
| 6,396,359 B1 | 5/2002 | Hajimiri et al. |
| 6,426,662 B1 | 7/2002 | Arcus |
| 6,525,618 B2 | 2/2003 | Wood |
| 6,556,089 B2 | 4/2003 | Wood |
| 6,566,968 B2 | 5/2003 | Aghahi |
| 6,574,288 B1 | 6/2003 | Welland et al. |
| 6,683,503 B2 | 1/2004 | Mizuno et al. |
| 6,781,424 B2 | 8/2004 | Lee et al. |
| 6,816,020 B2 | 11/2004 | Wood |
| 6,856,208 B2 | 2/2005 | Lee et al. |
| 6,870,431 B2 | 3/2005 | Afghahi |
| 6,900,699 B1 | 5/2005 | Kim |
| 6,909,127 B2 | 6/2005 | O'Mahony et al. |
| 6,943,599 B2 | 9/2005 | Ngo |
| 6,995,620 B2 | 2/2006 | Afghahi |
| 7,005,930 B1 | 2/2006 | Kim et al. |
| 7,085,668 B2 | 8/2006 | Johnson |
| 7,088,154 B2 | 8/2006 | Ngo |
| 7,091,802 B2 | 8/2006 | Ham et al. |
| 7,130,604 B1 | 10/2006 | Wong et al. |
| 7,203,914 B2 | 4/2007 | Wood |
| 7,209,065 B2 | 4/2007 | Wood |
| 7,224,199 B1 | 5/2007 | Kang |
| 7,224,235 B2 | 5/2007 | De Ranter et al. |
| 7,236,060 B2 | 6/2007 | Wood |
| 7,242,272 B2 | 7/2007 | Ham et al. |
| 7,274,262 B2 | 9/2007 | Ham et al. |
| 7,280,001 B2 | 10/2007 | Maligeorgos et al. |
| 7,295,076 B2 | 11/2007 | Kim et al. |
| 7,307,483 B2 | 12/2007 | Tzartzanis et al. |
| 7,315,219 B2 | 1/2008 | Chiang |
| 7,339,439 B2 | 3/2008 | Roubadia et al. |
| 7,378,893 B1 | 5/2008 | Kang |
| 7,397,230 B2 | 7/2008 | Tabaian et al. |
| 7,409,012 B2 | 8/2008 | Martin et al. |
| 7,439,777 B2 | 10/2008 | Wood |
| 7,446,578 B2 | 11/2008 | Huang |
| 7,471,153 B2 | 12/2008 | Kee et al. |
| 7,482,850 B2 | 1/2009 | Kawamoto |
| 7,482,884 B2 | 1/2009 | Wang et al. |
| 7,504,895 B2 | 3/2009 | Neidorff |
| 7,511,588 B2 | 3/2009 | Gabara |
| 7,513,873 B2 | 4/2009 | Shifrin |
| 7,515,005 B2 | 4/2009 | Dan |
| 7,541,794 B2 | 6/2009 | Tabaian et al. |
| 7,545,225 B2 | 6/2009 | Beccue |
| 7,551,038 B2 | 6/2009 | Jang et al. |
| 7,571,337 B1 | 8/2009 | Zhai et al. |
| 7,577,225 B2 | 8/2009 | Azadet et al. |
| 7,609,756 B2 | 10/2009 | Wood |
| 7,612,621 B2 | 11/2009 | Kim et al. |
| 7,616,070 B2 | 11/2009 | Tzartzanis et al. |
| 7,656,239 B2 | 2/2010 | Bietti et al. |
| 7,656,336 B2 | 2/2010 | Wood |
| 7,656,979 B2 | 2/2010 | Leydier et al. |
| 7,663,328 B2 | 2/2010 | Gonder |
| 7,675,334 B2 | 3/2010 | Kawamoto |
| 7,715,143 B2 | 5/2010 | Bliss et al. |
| 7,741,921 B2 | 6/2010 | Ismailov |
| 7,782,988 B2 | 8/2010 | Ziesler |
| 7,805,697 B2 | 9/2010 | Wood |
| 7,833,158 B2 | 11/2010 | Bartz |
| 7,847,643 B2 | 12/2010 | Da Dalt |
| 7,885,625 B2 | 2/2011 | Muhammad et al. |
| 7,893,778 B2 | 2/2011 | Mohtashemi et al. |
| 7,907,023 B2 | 3/2011 | Liang et al. |
| 7,911,284 B2 | 3/2011 | Kuwano |
| 7,924,076 B2 | 4/2011 | Suzuki et al. |
| 7,936,193 B2 | 5/2011 | Van Der Wel et al. |
| 7,944,316 B2 | 5/2011 | Watanabe et al. |
| 7,952,439 B1 | 5/2011 | Heggemeier et al. |
| 7,973,609 B2 | 7/2011 | Ohara et al. |
| 7,978,012 B2 | 7/2011 | Wood |
| 7,995,364 B2 | 8/2011 | Shiu |
| 8,008,981 B2 | 8/2011 | Hong et al. |
| 8,049,563 B2 | 11/2011 | Aoki et al. |
| 8,089,322 B2 | 1/2012 | Martchovsky et al. |
| 8,115,560 B2 | 2/2012 | Chung |
| 8,169,267 B2 | 5/2012 | De Mercey |
| 8,193,870 B2 | 6/2012 | Takinami et al. |
| 8,351,558 B2 | 1/2013 | Strandberg et al. |
| 8,410,858 B2 | 4/2013 | Wood |
| 8,629,807 B2 | 1/2014 | Wood et al. |
| 8,742,857 B2 | 6/2014 | Martchovsky et al. |
| 8,895,913 B2 | 11/2014 | Tekin et al. |
| 9,209,745 B2 | 12/2015 | Beccue |
| 9,473,069 B1 | 10/2016 | Beccue |
| 9,806,701 B1 | 10/2017 | Bellaouar et al. |
| 9,838,026 B2 | 12/2017 | Van Brunt |
| 10,277,233 B2 | 4/2019 | Shanan |
| 10,312,922 B2 | 6/2019 | Shanan |
| 10,567,154 B1 | 2/2020 | Wentzloff et al. |
| 10,608,652 B2 | 3/2020 | Zerbe et al. |
| 10,756,741 B2 | 8/2020 | Shanan |
| 2003/0128075 A1 | 7/2003 | Wood |
| 2003/0151465 A1 | 8/2003 | Wood |
| 2004/0233022 A1 | 11/2004 | Tsuzuki et al. |
| 2005/0068116 A1 | 3/2005 | Ham |
| 2006/0208776 A1 | 9/2006 | Tonietto et al. |
| 2007/0030041 A1 | 2/2007 | Huang et al. |
| 2008/0074202 A1 | 3/2008 | Gabara |
| 2008/0252386 A1 | 10/2008 | Kim |
| 2009/0215423 A1 | 8/2009 | Hwang et al. |
| 2009/0322394 A1 | 12/2009 | Song et al. |
| 2010/0066416 A1 | 3/2010 | Ohara et al. |
| 2010/0117744 A1 | 5/2010 | Takinami et al. |
| 2010/0156549 A1 | 6/2010 | Uemura et al. |
| 2010/0321121 A1 | 12/2010 | Mohtashemi |
| 2011/0095833 A1 | 4/2011 | Mohtashemi et al. |
| 2011/0156760 A1 | 6/2011 | Bhuiyan et al. |
| 2011/0156773 A1 | 6/2011 | Beccue |
| 2011/0195683 A1 | 8/2011 | Brekelmans et al. |
| 2011/0286510 A1 | 11/2011 | Levantino et al. |
| 2012/0008717 A1 | 1/2012 | van Sinderen et al. |
| 2012/0013363 A1 | 1/2012 | Takinami et al. |
| 2012/0013407 A1 | 1/2012 | Takinami et al. |
| 2012/0025918 A1 | 2/2012 | Wang et al. |
| 2012/0112841 A1 | 5/2012 | Hayashi |
| 2012/0185623 A1 | 7/2012 | Ross et al. |
| 2012/0212297 A1 | 8/2012 | Le Grand De Mercey et al. |
| 2013/0058384 A1 | 3/2013 | Otis et al. |
| 2013/0151465 A1 | 6/2013 | Baumgaertel |
| 2013/0154750 A1 | 6/2013 | Martchovsky |
| 2013/0271190 A1 | 10/2013 | Booth et al. |
| 2014/0362952 A1 | 12/2014 | Cheng et al. |

(56) References Cited

U.S. PATENT DOCUMENTS

| | | | |
|---|---|---|---|
| 2016/0204764 A1 | 7/2016 | Ferriss | |
| 2018/0102781 A1 | 4/2018 | Shanan | |
| 2018/0102782 A1* | 4/2018 | Shanan | H03B 5/1852 |
| 2019/0273468 A1 | 9/2019 | Dogan et al. | |
| 2019/0393882 A1 | 12/2019 | Bassi et al. | |
| 2020/0229088 A1 | 7/2020 | Wang et al. | |
| 2022/0045410 A1 | 2/2022 | Chuang et al. | |

FOREIGN PATENT DOCUMENTS

| | | |
|---|---|---|
| DE | 4322701 C1 | 8/1994 |
| EP | 0633662 A1 | 1/1995 |
| EP | 0696843 A1 | 2/1996 |
| EP | 0478134 B1 | 6/1997 |
| EP | 0583839 A1 | 11/1997 |
| EP | 0891045 B1 | 1/2002 |
| EP | 1 426 983 A1 | 6/2004 |
| GB | 1247199 | 9/1971 |
| GB | 2358562 | 7/2001 |
| JP | 60224205 | 11/1985 |
| JP | 4165809 | 6/1992 |
| JP | 2001274629 A | 10/2001 |
| WO | WO 95/12263 | 5/1995 |
| WO | WO 00/44093 | 7/2000 |
| WO | WO 2010/053215 A1 | 5/2010 |

OTHER PUBLICATIONS

Bubmann et al., "Active Compensation of Interconnect Losses of Multi-GHz Clock Distribution Networks," IEEE Transactions on Circuits and Systems-II: Analog and Digital Signal Processing, vol. 39, No. 11, Nov. 1992, pp. 790-798.

Chen, et al., "Rotary Traveling-Wave Oscillators, Analysis and Simulation," IEEE Transactions on Circuits and Systems-I: Regular Papers, vol. 58, No. 1, Jan. 2011, in 11 pages.

Chien, et al., "A 32 GHz Rotary Traveling-Wave Voltage Controlled Oscillator in 0.18-μm CMOS," IEEE MWCL, vol. 17, No. 10, pp. 724-726, Oct. 2007.

Deutsch, et al., "Modeling and Characterization of Long On-Chip Interconnections for High-Performance Microprocessors," IBM J Res. Develop., vol. 39, No. 5, Sep. 1995, pp. 547-567.

Divina et al., "The Distributed Oscillator at 4 GHZ," IEEE, Department Electromagnetic Field, May 1998, Czech Technical University in Prague, Technicka 2, 166 27 Praha 6, Czech Republic, pp. 1-4.

Dunning, Jim, "An All-Digital Phase-Locked Loop with 50-Cycle Lock Time Suitable for High-Performance Microprocessors," IEEE Journal of Solid-State Circuits, vol. 30, No. 4, Apr. 1995, pp. 412-422.

Guo, et al., "A 0.083 mm2 25.2-to-29.5 GHz Multi-LC-Trank Class-F234 VCO with a 189.6-dBc/Hz FOM," IEEE Solid State Circuits Letters, vol. 1, Issue 4, Apr. 2018.

Hall, et al., "Clock Distribution Using Cooperative Ring Oscillators," IEEE, Proceedings of the 17th Conference on Advanced Research in VLSI, Ann Arbor, MI (Sep. 15-16, 1997) pp. 62-75.

Hu, et al., "A Low-Flicker-Noise 30-GHz Class-F23 Oscillator in 28-nm CMOS using Implicit Resonance and Explicit Common-Mode Return Path," IEEE Journal of Solid-State Circuits, vol. 53, No. 7, Jul. 2018, in 11 pages.

Kato, Hatsuhiro, "A Dynamic Formulation of Ring Oscillator as Solitary-Wave Propagator," IEEE Transactions on Circuits and Systems-I: Fundamental Theory and Applications, vol. 45, No. 1, Jan. 1998, pp. 98-101.

Kim, et al., "A Low Phase-Noise CMOS LC Oscillator with a Ring Structure," 2000 IEEE International Solid-State Circuits Conference, 3 pages.

Kleveland, B. et al., "Line Inductance Extraction and Modeling in a Real Chip With Power Grid," IEEE IEDM Conference, 1999, Washington, D.C. pp 1-4.

Kleveland, et al., "50 GHz Interconnect Design in Standard Silicon Technology," IEEE MIT-S International Microwave Symposium, Baltimore, Maryland, Jun. 1998, 4 pages.

Kleveland, et al., "Monolithic CMOS Distributed Amplifier and Oscillator," 1999 IEEE International Solid-State Circuits Conference, 1999, 9 pages.

Kral, et al., "RF-CMOS Oscillators With Switched Tuning," Proceedings of the IEEE 1998 Custom Integrated Circuits Conference, pp. 555-558.

Larsson, Hakan, Distributed Synchronous Clocking Using Connected Ring Oscillators, Master's Thesis in Computer Systems Engineering, Centre for Computer Systems Architecture, Halmstad University: Halmstad, Sweden, Technical Report CCA—9705, Jan. 1997, pp. i-43.

Le Grand de Mercey, A 18GHz Rotary Traveling Wave VCO in CMOS with I/O Outputs, 29th European Solid State Circuits Conference, Sep. 2003.

Le Grand de Mercey, Gregoire, 18GHZ-36GHZ Rotary Traveling Wave Voltage Controlled Oscillator in a CMOS Technology, Aug. 2004, in 135 pages.

M.A. Shehata, M.Keaveney and R.B.Staszewski, "A 184.6-dBc/Hz FoM 100-kHz Flicker Phase Noise Corner 30-GHz Rotary Traveling-Wave Oscillator Using Distributed Stubs in 22-nm FD-SOI," ESSCIRC 2019—IEEE 45th European Solid State Circuits Conference (ESSCIRC), Cracow, Poland, 2019, pp. 103-106, doi:10.1109/ESSCIRC.2019.8902916.

M.A. Shehata, M.Keaveney and R.B.Staszewski, "A 184.6-dBc/Hz FoM 100-kHz Flicker Phase Noise Corner 30-GHz Rotary Traveling-Wave Oscillator Using Distributed Stubs in 22-nm FD-SOI," in IEEE Solid-State Circuits Letters, vol. 2, No. 9, pp. 103-106, Sep. 2019, doi:10.1109/LSSC.2019.2929326.

Miller, Brian, "A Multiple Modulator Fractional Divider," IEEE Transactions on Instrumentation and Measurement, vol. 40, No. 3, Jun. 1991, pp. 578-583.

Moroni et al., "Analysis and Design of a 54 GHz Distributed "Hybrid" Wave Oscillator Array with Quadrature Outputs," IEEE Journal of Solid-State Circuits, vol. 49, No. 5, May 2014, in 15 pages.

Nagashino, Hirofumi, et al., "Generation of Traveling Wave Mode in a Chained Neural Oscillator Network Model," IEEE, Proc. of the Int. Conference on Neural Networks (ICNN), New York, Mar. 1993, pp. 1550-1557.

Nouri et al., "A 45-GHz Rotary-Wave Voltage-Controlled Oscillator," IEEE Transactions on Microwave Theory and Techniques, vol. 59, No. 2, Feb. 2011, in 10 pages.

Skvor, Z., et al., "Novel Decade Electronically Tunable Microwave Oscillator Based on the Distributed Amplifier," IEEE Explore, Electronic Letters, vol. 28, No. 17, Aug. 1992, pp. 1647-1648.

Takinami, Koji, "Phase-Noise Analysis in Rotary Traveling Wave Oscillators Using Simple Physical Model," IEEE Transactions on Microwave Theory and Techniques, vol. 58, No. 6, Jun. 2010, in 10 pages.

Vigilante, et al., "A Coupled RTWO-Based Subharmonic Receiver Front End for 5G E-Band Backhaul Links in 28-nm Bulk CMOS," IEEE Journal of Solid State Circuits, vol. 53, No. 10, Oct. 2018, in 12 pages.

Wilson, et al., "A CMOS Self-Calibrating Frequency Synthesizer," IEEE Journal of Solid-State Circuits, vol. 35, No. 10, Oct. 2000, pp. 1437-1444.

Wood, John, et al., "Rotary Traveling-Wave Oscillator Arrays: A New Clock Technology," IEEE Journal of Solid-State Circuits, vol. 36, No. 11, Nov. 2001, in 12 pages.

Wu, et al., "E-Band Multi-Phase LC Oscillators with Rotated-Phase-Tuning Using Implicit Phase Shifters," IEEE JSSC, vol. 53, No. 9, pp. 2560-2571, Sep. 2018.

Yabuki, Hiroyuki, et al., "Miniaturized Stripline Dual-Mode Ring Resonators and Their Application to Oscillating Devices," IEEE MIT-S International Microwave Symposium Digest, New York, May 16, 1995, pp. 1313-1316.

Yue, et al., "On-Chip Spiral Inductors with Patterned Ground Shields for Si-Based RF IC's," IEEE Journal of Solid-State Circuits, vol. 33, No. 5, 1998, pp. 743-752.

(56) References Cited

OTHER PUBLICATIONS

Buadana et al., "A Triple Band Travelling Wave VCO Using Digitally Controlled Artificial Dielectric Transmission Lines" 2011 IEEE Radio Frequency Integrated Circuits Symposium, IEEE Xplore dated Jul. 5, 2011, in 4 pages.

Chi et al., "A +2.3dBm 124-158GHz Class-C frequency quadrupler with folded-transformer based multi-phase driving," 2015 IEEE RFIC, Phoenix, AZ, 2015, pp. 263-266, in 4 pages.

Chien et al., "A 900-MHz Local Oscillator Using a DLL-Based Frequency Multiplier Technique for PCS Applications" IEEE Journal of Solid-State Circuits ( vol. 35, Issue: 12) dated Dec. 2000, in 4 pages.

Choi., "Fully-Integrated DLL/PLL-Based CMOS Frequency Synthesizers for Wireless Systems" dated Jul. 15, 2010, in 119 pages.

Chung et al., "A 10-40 GHz frequency quadrupler source with switchable bandpass filters and > 30 dBc harmonic rejection" 2017 IEEE Radio Frequency Integrated Circuits Symposium (RFIC), dated Jul. 7, 2017, in 4 pages.

Fujibayashi et al., "A 76-to 81-GHz Multi-Channel Radar Transceiver" IEEE Journal of Solid-State Circuits (vol. 52, Issue: 9, Sep. 2017) dated May 25, 2017, in 16 pages.

Huang et al., "324GHz CMOS Frequency Generator Using Linear Superposition Technique," 2008 IEEE ISSCC, San Francisco, CA, 2008, pp. 476-629, in 3 pages.

Ku et al., "A Milliwatt-Level 70-110 GHz Frequency Quadrupler with >30 dBc Harmonic Rejection" IEEE Transactions on Microwave Theory and Techniques (vol. 68, Issue: 5, May 2020) dated Feb. 5, 2020, in 9 pages.

Kucharski et al., "D-Band Frequency Quadruplers in BiCMOS Technology," in IEEE JSSC, vol. 53, No. 9, pp. 2465-2478, Sep. 2018, in 15 pages.

Moroni et al., "Analysis and Design of a 54 GHz Distributed "Hybrid" Wave Oscillator Array with Quadrature Outputs" IEEE Journal of Solid-State Circuits (vol. 49, Issue: 5, May 2014) dated Mar. 31, 2014, in 15 pages.

Park et al., "76-81-GHz CMOS Transmitter with a Phase-Locked-Loop-Based Multichip Modulator for Automotive Radar" IEEE Transactions on Microwave Theory and Techniques (vol. 63, Issue: 4, Apr. 2015) dated Mar. 4, 2015, in 10 pages.

Rabbi et al., "A 42/84-GHz Multi-Ring Rotary Traveling-Wave Oscillator" 2019 SoutheastCon IEEE Xplore dated Mar. 5, 2020, in 5 pages.

Shehata et al., "A 32-42-GHz RTWO-Based Frequency Quadrupler Achieving >37 dBc Harmonic Rejection in 22-nm FD-SOI" IEEE Solid-State Circuits Letters, vol. 4, 2021, in 4 pages.

Shehata et al., "A Distributed Stubs Technique to Mitigate Flicker Noise Upconversion in a mm-Wave Rotary Traveling-Wave Oscillator," in IEEE Journal of Solid-State Circuits, vol. 56, No. 6, pp. 1745-1760, Jun. 2021, doi: 10.1109/JSSC.2020.3044278.

Shehata et al., "Correction to A 32-42-GHz RTWO-Based Frequency Quadrupler Achieving>37 dBc Harmonic Rejection in 22-nm FD-SOI" IEEE Solid-State Circuits Letters, vol. 4, 2021, in 1 page.

Wang et al., "A 9% power efficiency 121-to-137GHz phase-controlled push-push frequency quadrupler in 0.13 m SiGe BiCMOS," 2012 IEEE ISSCC, San Francisco, CA, 2012, pp. 262-264, in 3 pages.

Wang et al., "Delay-locked Loop Based Frequency quadrupler with wide operating range and fast locking characteristics" 2016 IEEE International Symposium on Circuits and Systems (ISCAS) dated Aug. 11, 2016 in 4 pages.

Wang, Weihu "Systematic Optimization of Phase Noise of Voltage-Controlled Oscillators for Millimeter-Wave Radar" dated Nov. 21, 2017, in 153 pages.

Zirath et al., "Development of 60-GHz front-end circuits for a high-data-rate communication system," IEEE JSSC, vol. 39, No. 10, pp. 1640-1649, Oct. 2004, in 10 pages.

Gathman et al., "A 92-GHz Deterministic Quadrature Oscillator and N-Push Modulator in 120-nm SiGe BiCMOS", IEEE—MTTS International Microwave Symposium Digest dated Jun. 2, 2013 in 4 pages.

Huang et al. "A DLL-Based Programmable Clock Generator Using Threshold-Trigger Delay Element and Circular Edge Combiner", Advanced System Integrated Circuits 2004. Proceedings Of 2004 IEEE ASI A—Pacific Conference dated Aug. 4, 2004, pp. 76-79.

Shehata et al., "A 32-42-GHz RTWO-Based Frequency Quadrupler Achieving >37 dBc Harmonic Rejection in 22-nm FD-SOI", IEEE Solid-State Circuits Letters, IEEE, vol. 4, Jan. 29, 2021, pp. 72-75.

Shehata et al., "A Distributed Stubs Technique to Mitigate Flicker Noise Upconversion in a mm-Wave Rotary Traveling-Wave Oscillator" IEEE Journal of Solid-State Circuits, Jan. 2021, in 16 pages.

* cited by examiner

ROTARY TRAVELING WAVE OSCILLATORS WITH DISTRIBUTED STUBS

CROSS-REFERENCE TO RELATED APPLICATIONS

The present application claims priority to U.S. Provisional Patent Application No. 62/902,753, filed Sep. 19, 2019, and titled "ROTARY TRAVELING WAVE OSCILLATORS WITH DISTRIBUTED STUBS," the entirety of which is hereby incorporated herein by reference.

FIELD

Embodiments of the invention relate to electronic systems, and more particularly, to rotary traveling wave oscillators (RTWOs).

BACKGROUND

A rotary traveling wave oscillator (RTWO) is a type of electronic oscillator in which a traveling wave moves around a closed differential loop that includes a cross-over for reversing the polarity of the traveling wave each loop transit. Additionally, energy of the traveling wave is preserved by maintaining amplifiers distributed about the loop. At any point along the loop, a differential clock signal is available by tapping the loop. The frequency of the differential clock signal is determined by the time taken by the traveling wave to propagate around the loop, and the phase of the differential clock signal is determined by the position along the loop that the differential clock signal is taken from.

RTWOs can be used in a variety of applications, including, for example, telecommunications systems, optical networks, and/or chip-to-chip communication. For instance, an RTWO can be used in a frequency synthesizer to generate an output clock signal having a controlled phase and frequency relationship to a reference clock signal.

SUMMARY OF THE DISCLOSURE

Rotary traveling wave oscillators (RTWOs) with distributed stubs are provided. In certain embodiments, an RTWO includes segments that are implemented using distributed stubs to mitigate flicker noise upconversion arising from transmission line dispersion. For example, a distance between the distributed stubs can be selected to intentionally generate a phase difference between transmission line modes, thereby cancelling out phase shifts due to transmission line dispersion. In particular, each segment is subdivided into multiple transmission line sections with a maintaining amplifier electrically connected to one of the sections and a tuning capacitor array connected to adjacent transmission line sections. By implementing the RTWO in this manner, the flicker phase noise corner is greatly improved.

In one aspect, an RTWO with low flicker phase noise is provided. The RTWO includes a differential transmission line connected as a ring having an odd number of crossovers, the differential transmission line configured to carry a traveling wave. The RTWO further includes a plurality of segments positioned around the ring, each of the plurality of segments comprising two or more stubs configured to compensate for a dispersion of the differential transmission line. The two or more stubs includes a first stub including a first pair of conductors connected to the differential transmission line and a maintaining amplifier connected between the first pair of conductors, and a second stub including a second pair of conductors connected to the differential transmission line and a first controllable capacitor connected between the second pair of conductors.

In another aspect, a method of oscillation in an RTWO is provided. The method includes propagating a traveling wave along a differential transmission line connected as a ring having an odd number of crossovers, controlling a capacitance of the differential transmission line using a plurality of segments positioned around the ring, maintaining energy of the traveling wave using the plurality of segments, and compensating for a dispersion of the differential transmission line using two or more stubs of each of the plurality of segments, the two or more stubs including a first stub including a first pair of conductors connected to the differential transmission line and a maintaining amplifier connected between the first pair of conductors, and a second stub including a second pair of conductors connected to the differential transmission line and a first controllable capacitor connected between the second pair of conductors.

In another aspect, an RTWO with low flicker phase noise is provided. The RTWO includes a differential transmission line connected as a ring having an odd number of crossovers, the differential transmission line configured to carry a traveling wave. The RTWO further includes a plurality of segments positioned around the ring, the plurality of segments are each configured to provide energy to the traveling wave and to control an oscillation frequency of the RTWO. Each of the segments includes two or more stubs that are distributed to compensate for a dispersion of the differential transmission line, and each of the two or more stubs includes a pair of conductors extending from the differential transmission line

DETAILED DESCRIPTION OF EMBODIMENTS

Figure 1:
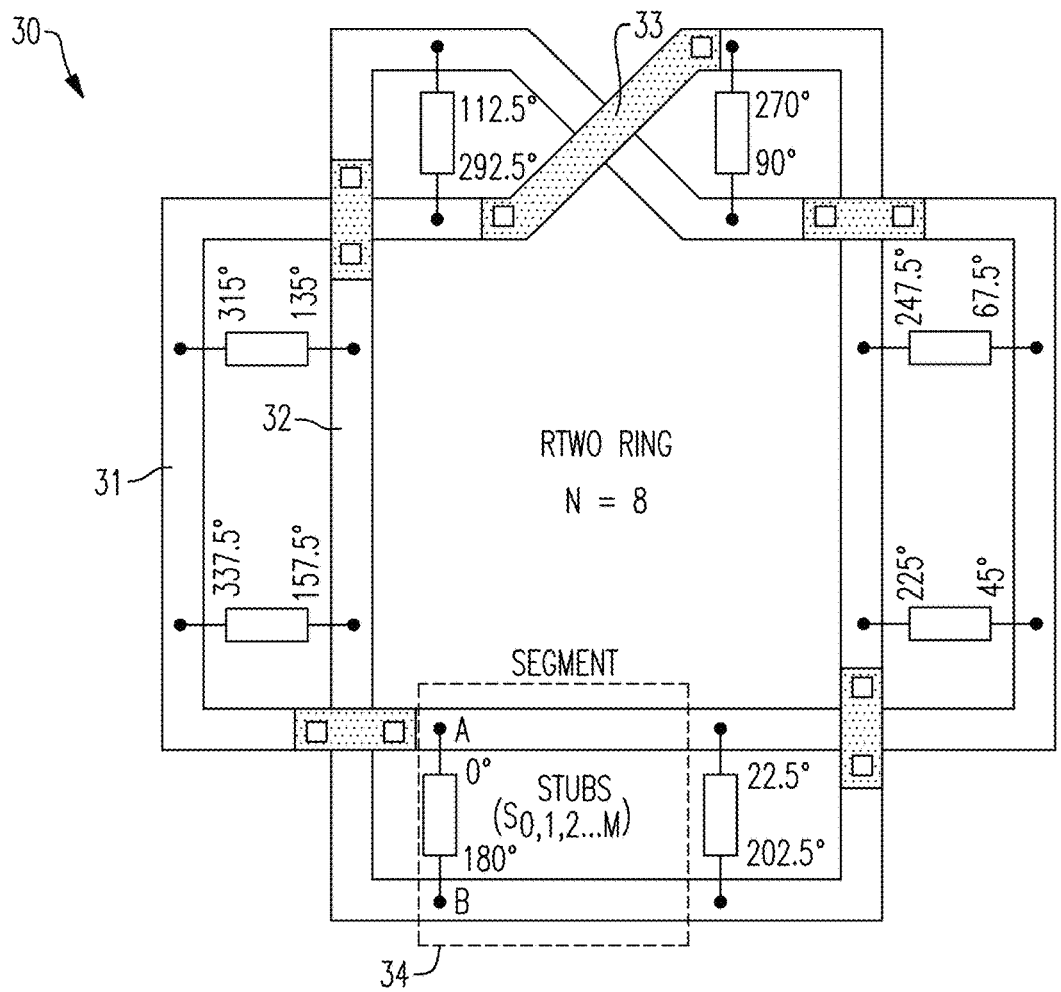
FIG. 1 is a schematic diagram of a rotary traveling wave oscillator (RTWO) according to one embodiment.

The following detailed description of embodiments presents various descriptions of specific embodiments of the invention. However, the invention can be embodied in a multitude of different ways. In this description, reference is made to the drawings, where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As persons having ordinary skill in the art will appreciate, a rotary traveling wave oscillator (RTWO) includes a differential transmission line connected in a ring with an odd number of one or more crossovers (for instance, a Möbius ring), and a plurality of maintaining amplifiers electrically connected along a path of the differential transmission line. Additionally, each of the crossovers reverses the polarity of a wave propagating along the differential transmission line, and the maintaining amplifiers provide energy to the wave to compensate for the differential transmission line's losses.

In certain implementations, the ring is partitioned into segments evenly distributed around the ring, with each segment including a single stub having a pair of conductors extending from the differential transmission line and to which a maintaining amplifier and a tuning capacitor array are connected between. For example, the maintaining amplifier can be implemented using a pair of back-to-back inverters that compensate for the segment's losses and ensure differential operation, while the tuning capacitor array serves to tune the oscillation frequency of the RTWO over a wide tuning range and/or to provide a fine frequency step size.

RTWOs can be used in a variety of applications, including, for example, telecommunications systems, optical networks, and/or chip to chip communication. For instance, an RTWO can be used in a frequency synthesizer to generate an output clock signal having a controlled phase and frequency relationship to a reference clock signal.

An RTWO has an ability to generate multiple clock signal phases at millimeter-wave (mmW) frequencies, while achieving low phase noise (PN). Unfortunately, due to transmission line (TL) dispersion, RTWOs suffer from flicker noise upconversion. As a result, phase shifts occur among the transmission line's modes, thus giving rising to a phase distortion (AM-PM) conversion mechanism.

In certain embodiments herein, an RTWO includes segments that are implemented using distributed stubs to mitigate flicker noise upconversion arising from transmission line dispersion. For example, in certain implementations, a distance between the distributed stubs is selected to intentionally generate a phase difference between transmission line modes, thereby cancelling out phase shifts due to transmission line dispersion. In particular, each segment is subdivided into multiple transmission line sections with a maintaining amplifier electrically connected to one of the sections and a tuning capacitor array connected to adjacent transmission line sections.

By separating the physical connections of the maintaining amplifier and the tuning capacitor array by a physical predetermined distance along the RTWO's ring, a phase shift is deliberately introduced.

By virtue of this technique, the flicker phase noise corner as well as other performance metrics of the RTWO is greatly improved. In one example, an RTWO with a frequency tuning range of 26.2 GHz to 30 GHz is implemented in a 22 nm FD-SOI CMOS process and achieves phase noise of −107.6 dBc/Hz and −128.9 dBc/Hz at 1 MHz offset and 10 MHz offset, respectively, when tuned at 30 GHz. This in turn translates to figure of merit (FOM) values of 184.2 dBc/Hz and 185.4 dBc/Hz, respectively. Additionally, power consumption was measured to be about 20 mW from a 0.8 V supply. Furthermore, a flicker noise corner of 180 kHz was achieved, which is an order of magnitude better than state-of-the-art mmW RTWOs.

The oscillating square-wave-like voltage waveform in an RTWO can be expressed by a Fourier series as indicated in Equation 1 below, where $\omega_1$ is the fundamental angular frequency, k=2, 3, ..., $A_k$ is the harmonic amplitude, and $\theta_k$ is the dispersion-induced phase shift between the fundamental and the k-th harmonic frequency components at steady state (ideally, $\theta_k$=0, if no transmission line dispersion).

$$v(t) = A_1 \sin(\omega_1 t) + \sum_{k \, even} A_k \cos(k\omega_1 t + \theta_k) + \sum_{k \, odd} A_k \sin(k\omega_1 t + \theta_k) \qquad \text{Equation 1}$$

In reality, the RTWO suffers from the transmission line dispersion which arises due to impedance discontinuities caused by the maintaining amplifier's loading and the shape of different segments, i.e. straight, corner, and crossover. This can result in significant phase shifts between harmonics relative to the ideal phase shifts in the approximating square wave.

For simplicity and to reflect the heavy filtering of higher harmonics by the mmW ring resonator, Equation 1 is approximated and reduced to Equation 2 below by considering only the fundamental (H1) and second-harmonic (H2) frequency components, where $A_1$ and $A_2$ are the amplitudes of H1 and H2, respectively, and $\theta_2$ is the dispersion-induced phase shift between H1 and H2 at steady state.

$$v(t)=A_1 \sin(\omega_1 t)+A_2 \cos(2\omega_1 t+\theta_2) \qquad \text{Equation 2}$$

The line losses of an RTWO are compensated using periodically spaced maintaining amplifiers, which act as differential negative resistors. The output current waveform of a maintaining amplifier, considering the lower-order terms of its non-linear transconductance, is given by Equation 3 below, where $g_1$, $g_2$, and $g_3$ correspond to the small-signal and higher-order transconductance gain coefficients, respectively.

$$i(t)=g_1 v(t)+g_2 v^2(t)+g_3 v^3(t) \qquad \text{Equation 3}$$

Substituting Equation 2 into Equation 3 and keeping only the terms at fundamental frequency leads to Equation 4 below.

$$i(t)=I_1 \sin(\omega_1 t+\varphi)=I_{osc} \sin(\omega_1 t)-I_{dis} \sin(\omega_1 t+\theta_2) \qquad \text{Equation 4}$$

Furthermore, Equations 5, 6, and 7 below provide expressions relating to phi ($\varphi$), which is sensitive to the maintaining amplifier's characteristics and the harmonic amplitudes, both of which can be influenced by the flicker noise-induced variations in the transistors. $I_{osc}$ represents the main oscillating current component that is aligned in phase with the H1 voltage component, whereas $I_{dis}$ is the additional current component due to the dispersion-induced phase shift ($\theta_2$) between H1 and H2.

$$\varphi = \sin^{-1}\left[\sin(\theta_2)\frac{I_{dis}}{\sqrt{I_{osc}^2 + I_{dis}^2 + 2I_{osc}I_{dis}\cos(\theta_2)}}\right] = \qquad \text{Equation 5}$$

$$\sin^{-1}\left[\sin(\theta_2)\frac{g_2 A_1 A_2}{I_1(g_{1-3}, A_{1-2})}\right]$$

$$I_{osc} = g_1 A_1 + \frac{3}{2}g_3 A_1 A_2^2 + \frac{3}{4}g_3 A_1^3 \qquad \text{Equation 6}$$

$$I_{dis} = g_2 A_1 A_2 \qquad \text{Equation 7}$$

From this, it is apparent that to reduce the AM-PM conversion gain, the sensitivity of $\varphi$ to $g_{1-3}$ and $A_{1-2}$ must be kept low, for instance, minimized.

A quick inspection of Equation 5 suggests that reduced AM-PM conversion can be achieved by minimizing $\theta_2$. This can be practically accomplished by slowing down the higher harmonics thus ensuring that the transmission line dispersion is minimized.

FIG. 1 is a schematic diagram of an RTWO 30 according to one embodiment. The RTWO 30 includes a differential transmission line including a first conductor 31 and a second conductor 32. As shown in FIG. 1, the differential transmission line (31, 32) is connected in a closed-loop or ring, and the differential transmission line includes a crossover 33 to provide inversion to a traveling wave propagating around the ring. Various phases of the traveling wave have been annotated along the differential transmission line. The RTWO 30 of FIG. 1 further includes a plurality of segments (N=8, in this example). One such segment 34 is indicated in FIG. 1.

In the illustrated embodiment, the RTWO's differential transmission line is connected in a closed-loop and is folded at each of four corners. However, the RTWO's differential transmission line can be implemented in other ways, including, for example, different implementations of folding and/or routing of the conductors 31 and 32.

One way to reduce the transmission line dispersion effect is to intentionally generate a phase difference between transmission line modes that cancels out the phase shifts due to transmission line dispersion and considerably reducing the flicker noise upconversion. In particular, each segment of the RTWO 30 can be implemented using distributed stubs, in which each segment is divided in two or more stubs to intentionally generate a phase difference between transmission line modes, thereby cancelling out phase shifts due to transmission line dispersion.

Figure 2A:
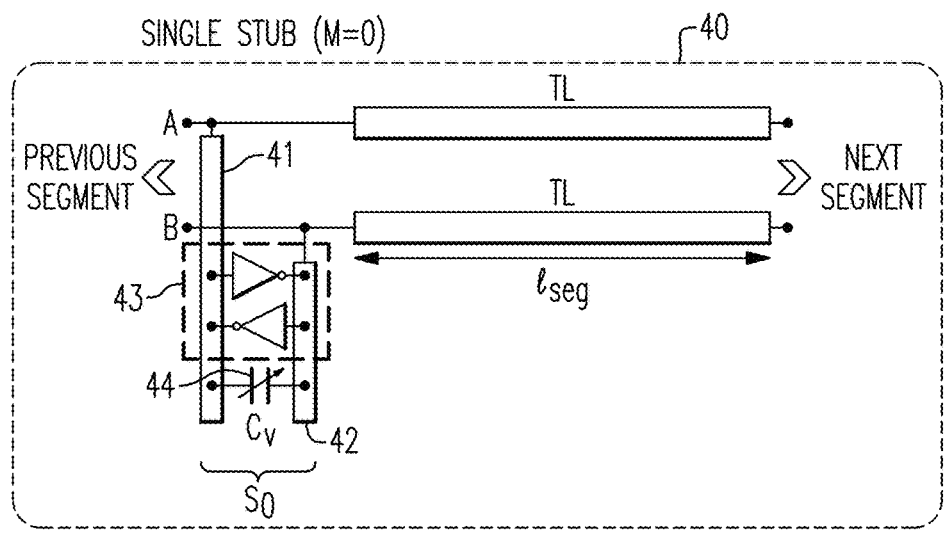
FIG. 2A is a schematic diagram of a segment for inclusion in the RTWO of FIG. 1 in which the segment includes a single stub.

FIG. 2A is a schematic diagram of a segment 40 for inclusion in the RTWO 30 of FIG. 1 in which the segment 40 includes a single stub S0.

The single stub S0 is associated with a segment length $l_{seg}$ of the RTWO's differential transmission line. Additionally, the single stub S0 includes a pair of conductors 41, 42 that extend substantially perpendicularly from the RTWO's differential transmission line, and to which a maintaining amplifier 43 (back-to-back inverters, in this example), and a tunable capacitor array 44 ($C_V$) are electrically connected between.

Figure 2B:
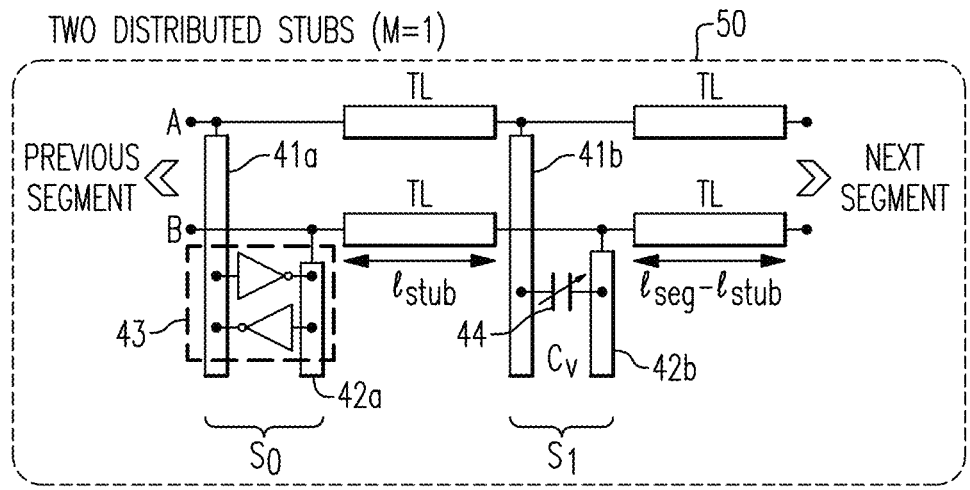
FIG. 2B is a schematic diagram of a segment for inclusion in the RTWO of FIG. 1 in which the segment includes two distributed stubs.

FIG. 2B is a schematic diagram of a segment 50 for inclusion in the RTWO 30 of FIG. 1 in which the segment 50 includes two distributed stubs (a first stub S0 and a second stub S1).

The RTWO segment 50 is associated with a segment distance $l_{eg}$ of the RTWO's differential transmission line. Additionally, the first stub S0 is separated from the second stub S1 by a stub distance $l_{stub}$, and the second stub S1 is separated from the next segment of the RTWO by a length of transmission line corresponding to $l_{seg}-_{stub}$.

In the illustrated embodiment, the first stub S0 includes a pair of conductors 41a, 42a that extend substantially perpendicularly from the RTWO's differential transmission line, and to which a maintaining amplifier 43 (back-to-back inverters, in this example) is electrically connected between. Additionally, the second stub S1 includes a pair of conductors 41b, 42b that extend substantially perpendicularly from the RTWO's differential transmission line, and to which a tunable capacitor array 44 ($C_V$) is electrically connected between.

A phase shift is deliberately introduced by separating the tuning capacitor array 44 from the maintaining amplifier 43 by a physical distance $l_{stub}$ along the RTWO ring. Thus, a dedicated stub is utilized for the maintaining amplifier whereas another dedicated stub is used for connecting a tuning capacitor array.

By implementing the RTWO segment in this manner, flicker phase noise ($1/f^3$) corner of a mmW RTWO is greatly improved.

Figure 2C:
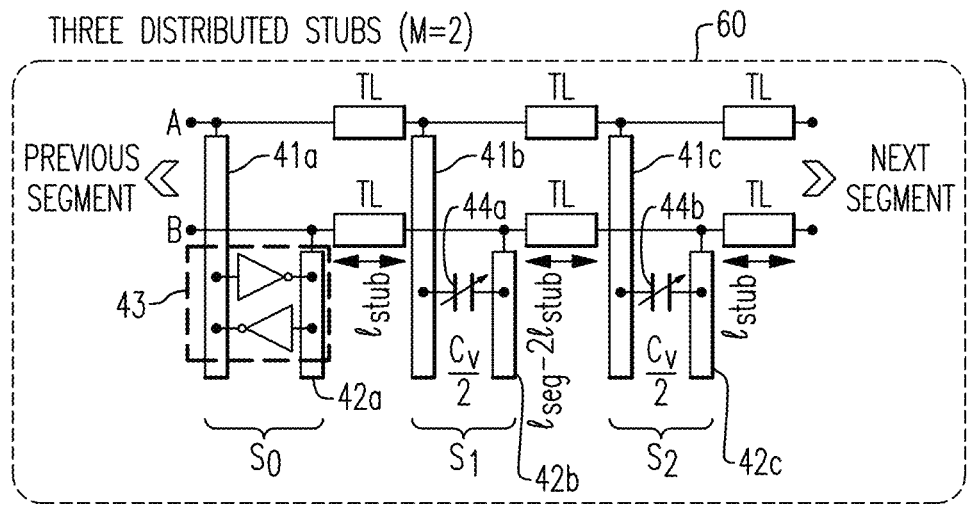
FIG. 2C is a schematic diagram of a segment for inclusion in the RTWO of FIG. 1 in which the segment includes three distributed stubs.

FIG. 2C is a schematic diagram of a segment 60 for inclusion in the RTWO 30 of FIG. 1 in which the segment 60 includes three distributed stubs (a first stub S0, a second stub S1, and a third stub S2).

As shown in FIG. 2C, the RTWO segment 60 is associated with a segment length $l_{seg}$ of the RTWO's differential transmission line. Additionally, the first stub S0 is separated from the second stub S1 by a stub distance $l_{stub}$, while the second stub S1 is separated from the third stub S2 by a distance of transmission line corresponding to $l_{seg}-2l_{stub}$, and the third stub S2 is separated from the next segment of the RTWO by a distance of transmission line corresponding to $l_{stub}$.

In the illustrated embodiment, the first stub S0 includes a pair of conductors 41a, 42a that extend substantially perpendicularly from the RTWO's differential transmission line, and to which a maintaining amplifier 43 (back-to-back inverters, in this example) is electrically connected between. Additionally, the second stub S1 includes a pair of conductors 41b, 42b that extend substantially perpendicularly from the RTWO's differential transmission line, and to which a first tunable capacitor array 44a (half of $C_V$ or $C_V/2$) is electrically connected between. Furthermore, the third stub S2 includes a pair of conductors 41c, 42c that extend substantially perpendicularly from the RTWO's differential transmission line, and to which a second tunable capacitor array 44b (half of $C_V$) is electrically connected between.

Distribution of stubs is applicable to two stubs per segment, three stubs per segment, or four or more stubs per segment. Thus, although certain embodiments herein are depicted in the context of two stubs per segment or three stubs per segment, an RTWO's segments can also each be implemented with four or more stubs per segment.

Figure 3:
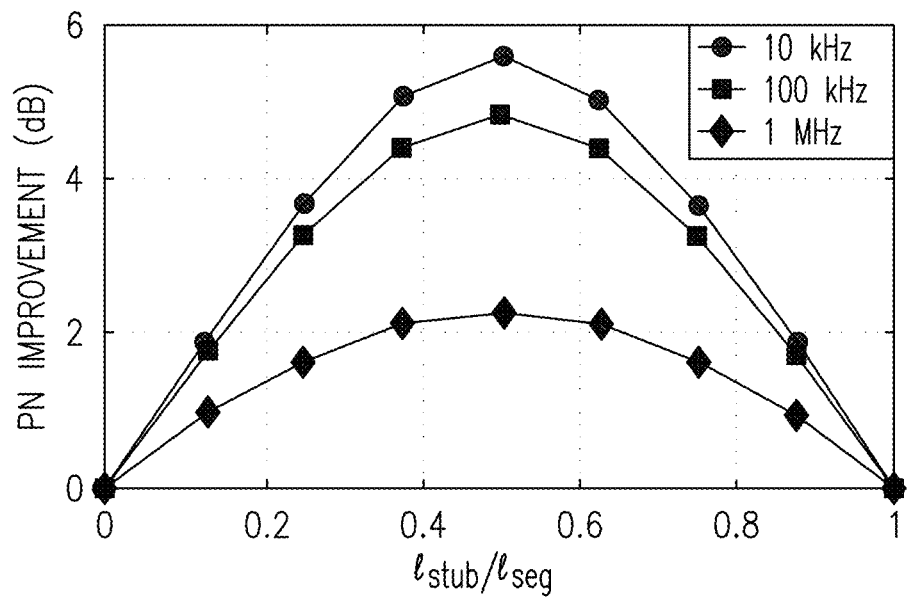
FIG. 3 is a graph of RTWO phase noise improvement at different offset frequencies versus the ratio between distance between stubs and a segment's length for two distributed stubs per segment relative to a single stub.

FIG. 3 is a graph of phase noise improvement versus the ratio between distance between stubs and a segment's length for one implementation of an RTWO using two distributed stubs per segment. The graph corresponds to simulations of the RTWO segment 50 of FIG. 2B and includes plots for different offsets from the carrier frequency (30 GHz, in this example).

The phase noise improvement is shown relative to an implementation with a single stub per segment. Maximum phase noise improvements of about 5.6 dB, 4.8 dB, and 2.2 dB for frequency offsets of 10 kHz, 100 kHz, and 1 MHz, respectively, are obtained when maximum phase shift occurs at $l_{stub}$ equal to about $l_{seg}/2$, at which maximum possible cancellation of transmission line dispersion is achieved.

Figure 4:
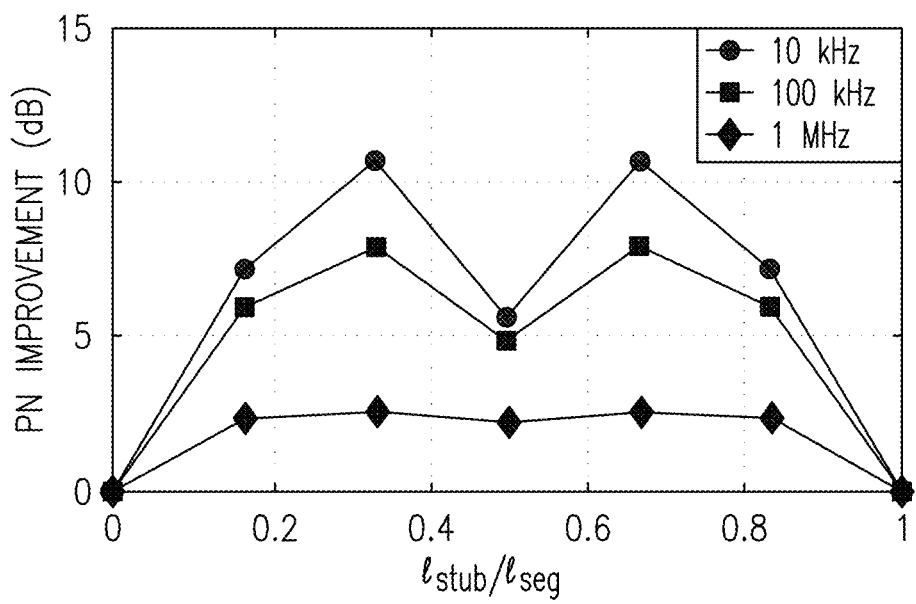
FIG. 4 is a graph of RTWO phase noise improvement at different offset frequencies versus the ratio between distance between stubs and a segment's length for three distributed stubs per segment relative to a single stub.

FIG. 4 is a graph of phase noise improvement versus the ratio between distance between stubs and a segment's length for one implementation of an RTWO using three distributed stubs per segment. The graph corresponds to simulations of the RTWO segment 60 of FIG. 2C and includes plots for different offsets from the carrier frequency (30 GHz, in this example).

The phase noise improvement is shown relative to an implementation with a single stub per segment. Maximum phase noise improvements of about 10.7 dB, 7.9 dB, and 2.6 dB for frequency offsets of 10 kHz, 100 kHz, and 1 MHz, respectively, are obtained when maximum phase shift occurs at $l_{stub}$ equal to about $l_{seg}/3$, at which maximum possible cancellation of transmission line dispersion is achieved.

As shown in FIG. 3 and FIG. 4, a higher phase noise improvement is realized at low frequency offsets at which flicker noise is dominating.

FIGS. 5A-5F generally relate to simulations pertaining to impulse sensitivity function (ISF) of an eight segments RTWO with a 30 GHz carrier frequency.

Figure 5A:
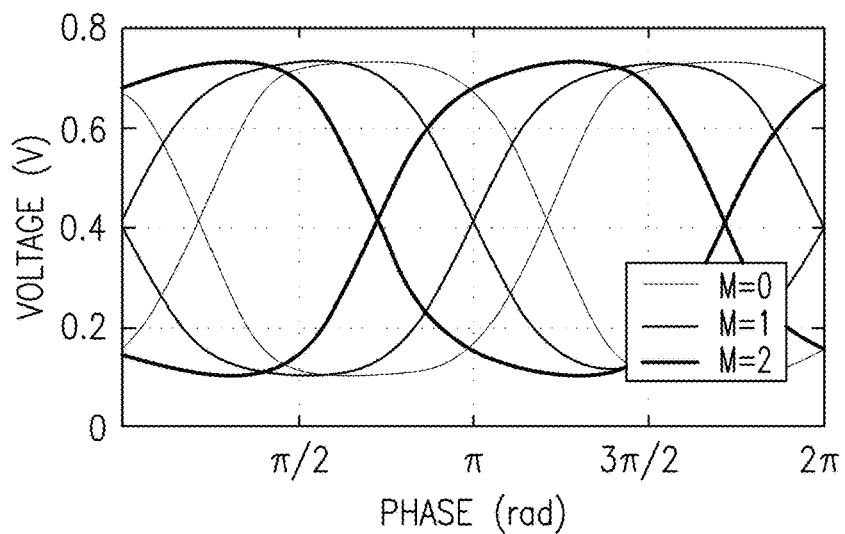
FIG. 5A is a graph comparing voltage versus phase for an RTWO using a single stub per segment relative to an RTWO using two or three distributed stubs per segment.

FIG. 5A is a graph comparing voltage versus phase for an RTWO using a single stub per segment relative to an RTWO using two or three distributed stubs per segment.

Figure 5B:
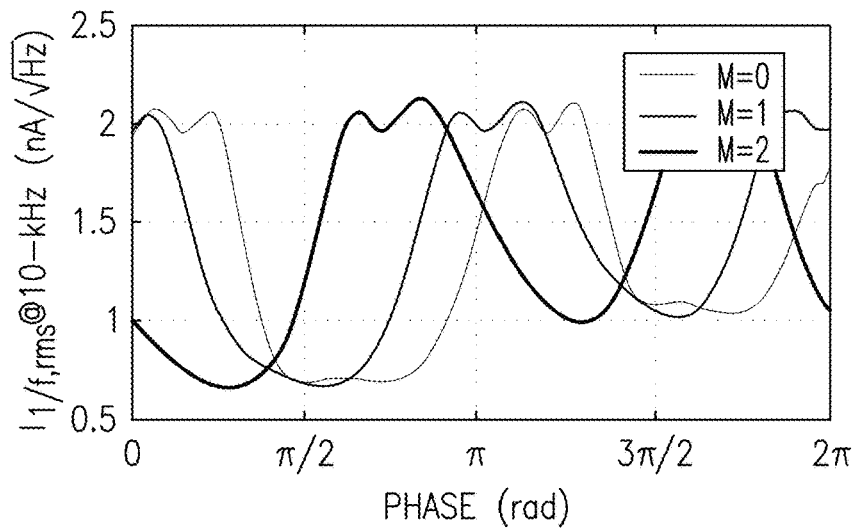
FIG. 5B is a graph comparing noise current versus phase for an RTWO using a single stub per segment relative to an RTWO using two or three distributed stubs per segment.

FIG. 5B is a graph comparing noise current versus phase for an RTWO using a single stub per segment relative to an RTWO using two or three distributed stubs per segment. The noise current waveforms correspond to a 10 kHz offset from the carrier frequency.

Figure 5C:
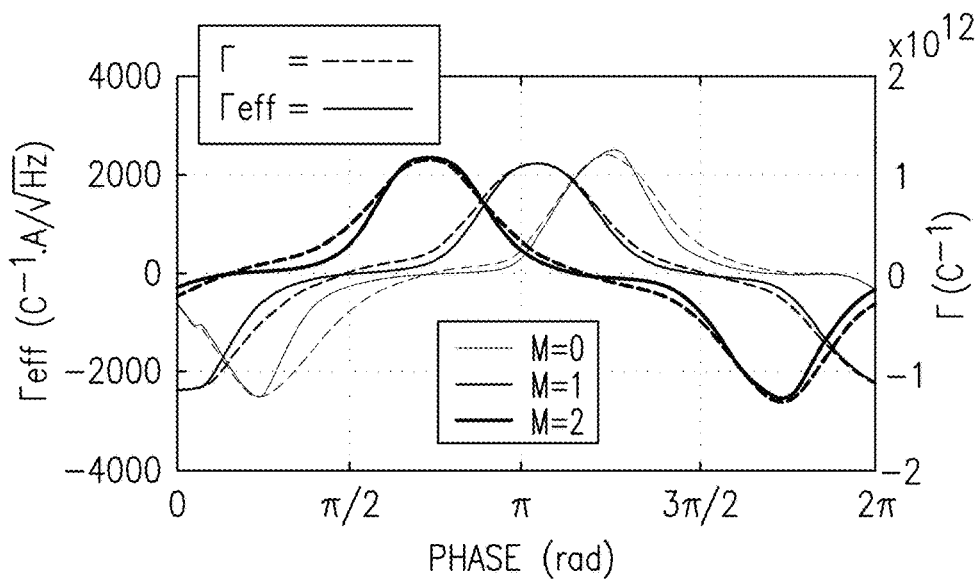
FIG. 5C is a graph comparing impulse sensitivity function (ISF) and effective ISF versus phase for an RTWO using a single stub per segment relative to an RTWO using two or three distributed stubs per segment.

FIG. 5C is a graph comparing ISF and effective ISF versus phase for an RTWO using a single stub per segment relative to an RTWO using two or three distributed stubs per segment.

Figure 5D:
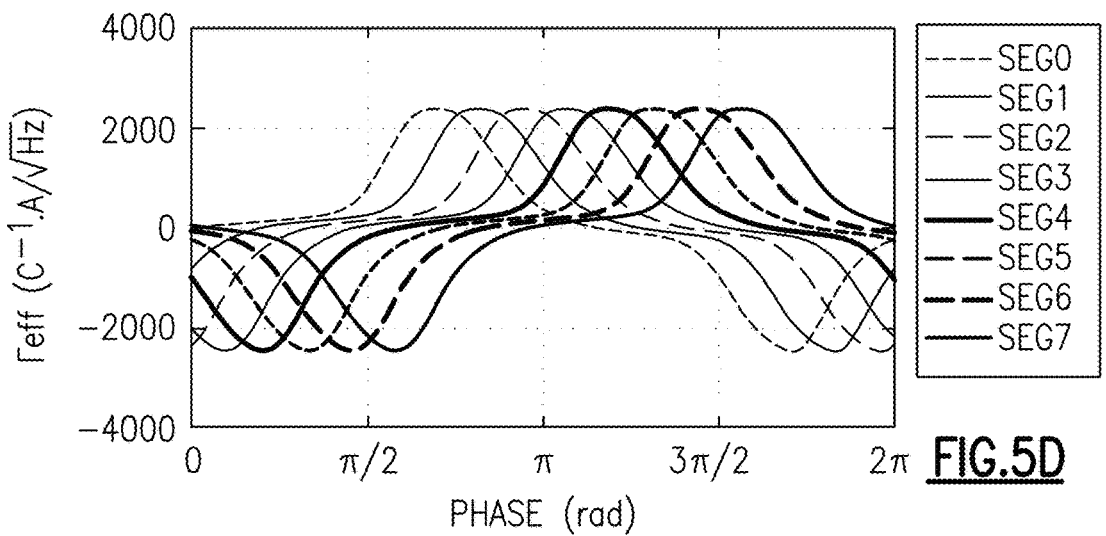
FIG. 5D is a graph of effective ISF for each segment of an RTWO using three distributed stubs per segment.

FIG. 5D is a graph of effective ISF for each segment of an RTWO using three stubs per segment.

Figure 5E:
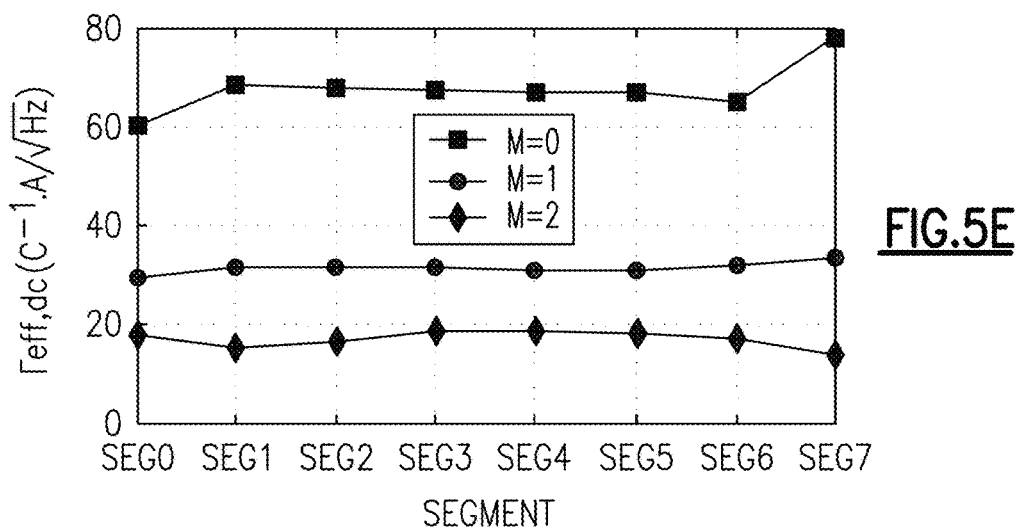
FIG. 5E is a graph comparing DC value of effective ISF for each segment as compared for an RTWO using a single stub per segment relative to an RTWO using two or three distributed stubs per segment.

FIG. 5E is a graph comparing DC value of effective ISF for each segment as compared for an RTWO using a single stub per segment relative to an RTWO using two or three distributed stubs per segment.

Figure 5F:
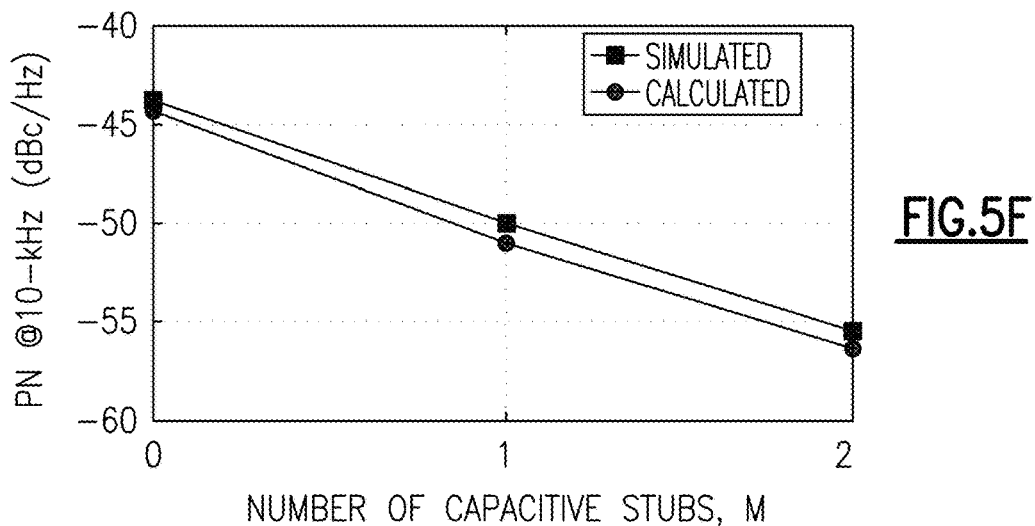
FIG. 5F is a graph comparing calculated versus simulated phase noise versus number of capacitive stubs per segment.

FIG. 5F is a graph comparing calculated versus simulated phase noise versus number of capacitive stubs per segment.

In the single stub per segment configuration, the transmission line dispersion causes asymmetries between the rising and falling parts of voltage waveform, whereas the positive area of effective ISF is wider than that of the negative area. Accordingly, the DC value of effective ISF is not equal zero. However, by using two or three distributed stubs per segment, the effective ISF can be shaped to be more symmetric, causing the phase change in the two regions to cancel each other within one period. The DC value of effective ISF represents the contribution of flicker noise to phase noise conversion, which means that lower DC value of effective ISF indicates low phase noise.

Figure 6:
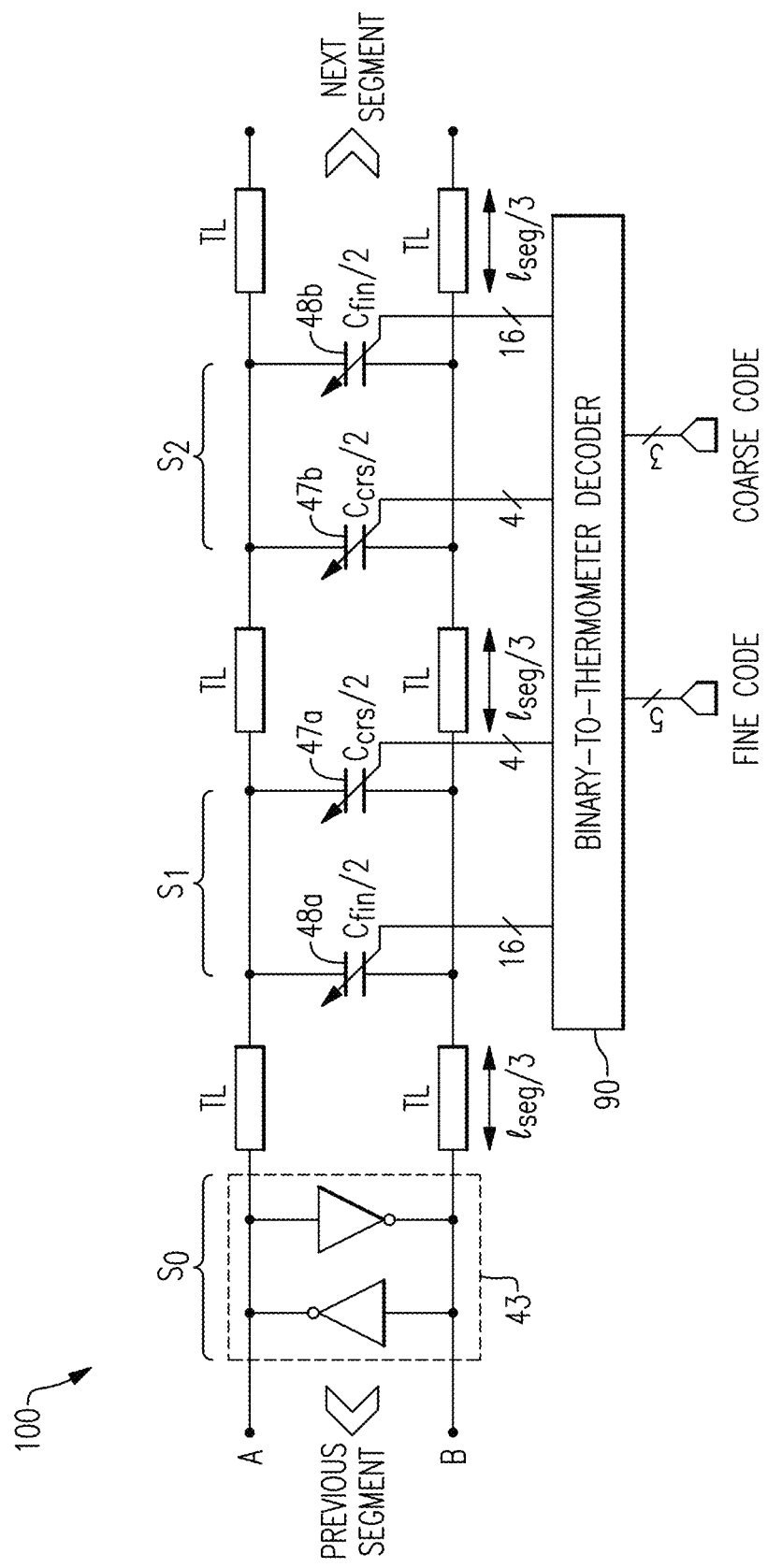
FIG. 6 is a schematic diagram of another embodiment of a segment of an RTWO.

FIG. 6 is a schematic diagram of another embodiment of a segment 100 of an RTWO. The segment 100 is subdivided into three stubs (a first stub S0, a second stub S1, and a third stub S2).

As shown in FIG. 6, the RTWO segment 100 is associated with a segment length $l_{seg}$ of the RTWO's differential transmission line. Additionally, the first stub S0 is separated from the second stub $S_1$ by a stub length $l_{stub}=l_{seg}/3$. Furthermore, the second stub S1 is separated from the third stub S2 by $l_{seg}/3$. Moreover, the third stub S2 is separated from the next segment by $l_{seg}/3$. Thus, each of the RTWO's distributed stubs is substantially equidistant, in this embodiment.

In the illustrated embodiment, the first stub S0 includes a maintaining amplifier 43 (back-to-back inverters, in this example), the second stub S1 includes a first coarse tunable capacitor array 47a (providing a highest capacitance $C_{crs}/2$) and a first fine tunable capacitor array 48a (providing a highest capacitance $C_{fin}/2$), and the third stub S2 includes a second coarse tunable capacitor array 47b (providing a highest capacitance $C_{crs}/2$) and a second fine tunable capacitor array 48b (providing a highest capacitance $C_{fin}/2$).

As shown in FIG. 6, a binary-to-thermometer decoder 90 controls the tuning capacitor values of the RTWO segment 100 to provide control over an oscillation frequency of the RTWO. In this example, the binary-to-thermometer decoder 90 receives a three bit coarse code, which is decoded to generate a first four bit coarse tuning signal for controlling the first coarse tunable capacitor array 47a and a second four bit coarse tuning signal for controlling the second coarse tunable capacitor array 47b. Additionally, the binary-to-thermometer decoder 90 receives a five-bit fine code, which is decoded to generate a first sixteen-bit fine tuning signal for controlling the first fine tunable capacitor array 48a and a second sixteen bit fine tuning signal for controlling the second fine tunable capacitor array 48b.

Figure 7A:
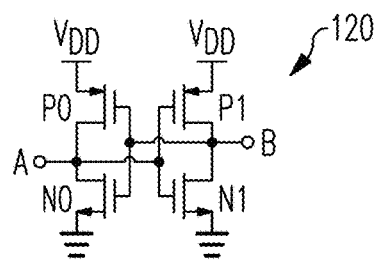
FIG. 7A a schematic diagram of one embodiment of a maintaining amplifier for the RTWO segment of FIG. 6.

FIG. 7A a schematic diagram of one embodiment of a maintaining amplifier 120 for the RTWO segment 100 of FIG. 6. The maintaining amplifier includes n-type metal oxide semiconductor (NMOS) transistors N0 and N1, and p-type metal oxide semiconductor (PMOS) transistors P0 and P1 arranged as back-to-back inverters. Although an example of a maintaining amplifier using a pair of back-to-back inverters is depicted, the teachings herein are applicable to segments including other types of maintaining amplifiers.

Figure 7B:
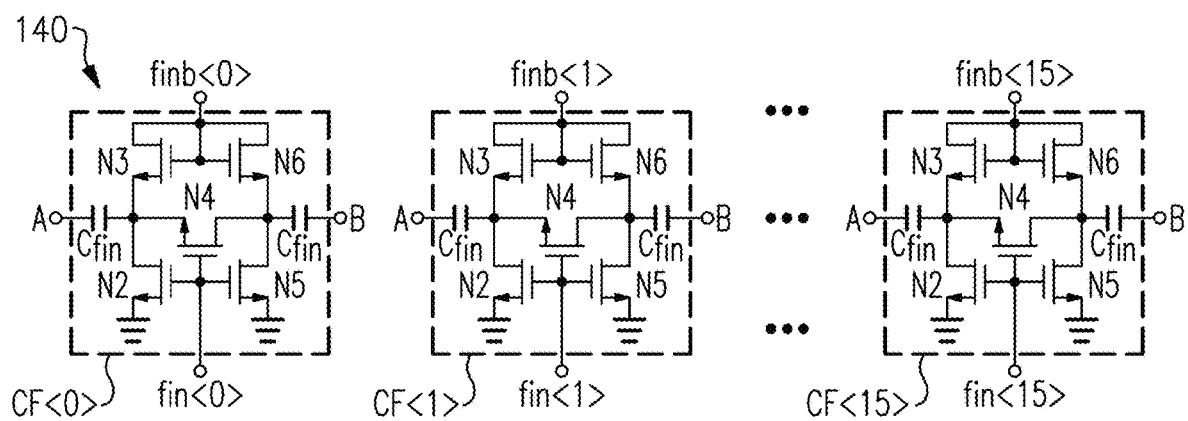
FIG. 7B a schematic diagram of one embodiment of a fine-tuning capacitor array for the RTWO segment of FIG. 6.

FIG. 7B a schematic diagram of one embodiment of a fine-tuning capacitor array 140 for the RTWO segment 100 of FIG. 6. The fine-tuning capacitor array 140 includes sixteen slices or instantiations of the circuitry depicted, with each instantiation controlled by a different fine control bit (fin) and inverted fine control bit (finb) for fine tuning.

In particular, the fine-tuning capacitor array 140 includes slices CF<0>, CF<1>, CF<15>. Additionally, the slices CF<0>, CF<1>, . . . CF<15> receive fine control bits fin<0>, fin<1>, . . . fin<15> and inverted fine control bits finb<0>, finb<1>, . . . finb<15>, respectively.

Each slice of the fine-tuning capacitor array 140 is implemented using NMOS transistors N2, N3, N4, N5, and N6 and using a differential implementation of metal-oxide-metal (MOM) capacitors with capacitance $C_{fin}$.

Figure 7C:
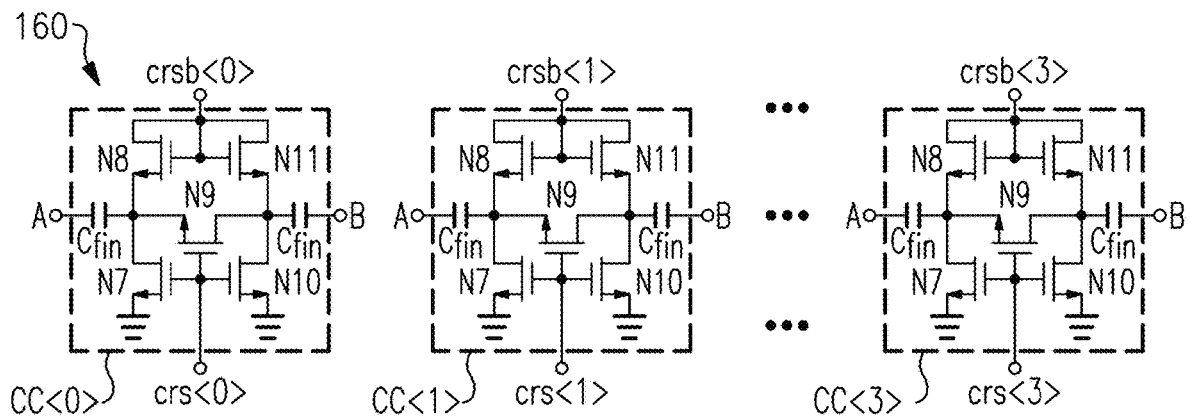
FIG. 7C a schematic diagram of one embodiment of a coarse-tuning capacitor array for the RTWO segment of FIG. 6.

FIG. 7C a schematic diagram of one embodiment of a coarse-tuning capacitor array 160 for the RTWO segment 100 of FIG. 6. The coarse-tuning capacitor array 160 includes four slices or instantiations of the circuitry depicted, with each instantiation controlled by a different coarse control bit (crs) and inverted coarse control bit (crsb) for coarse tuning.

In particular, the coarse-tuning capacitor array 160 includes slices CC<0>, CC<1>, . . . CC<3>. Additionally, the slices CC<0>, CC<1>, . . . CF<3> receive coarse control bits crs<0>, crs<1>, . . . crs<3> and inverted coarse control bits crsb<0>, crsb<1>, . . . crsb<3>, respectively.

Each slice of the coarse-tuning capacitor array 160 is implemented using NMOS transistors N7, N8, N9, N10, and N11 and using a differential implementation of MOM capacitors with capacitance $C_{crs}$.

Figure 8A:
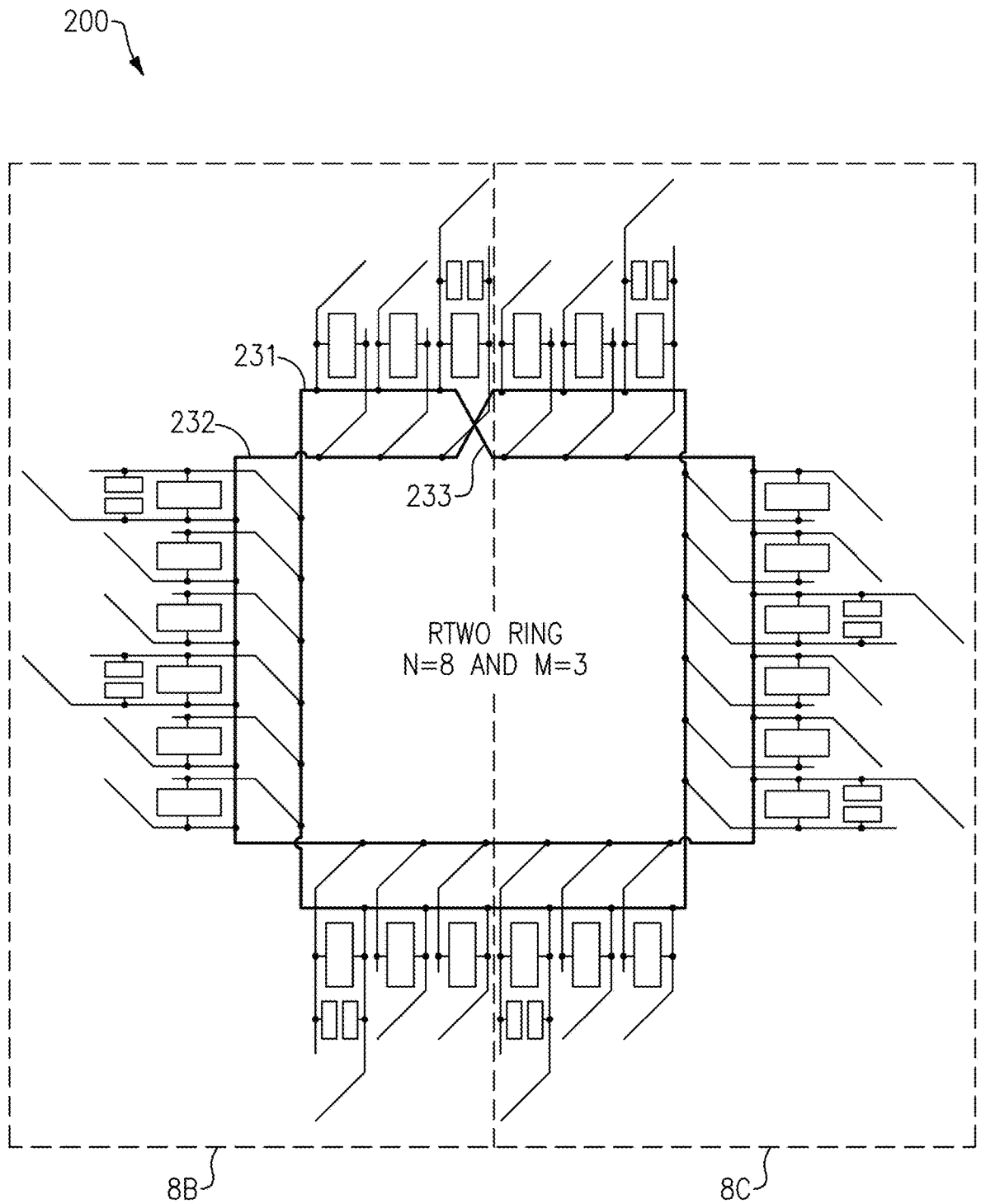
FIG. 8A is a schematic diagram of another embodiment of an RTWO.
Figure 8B:
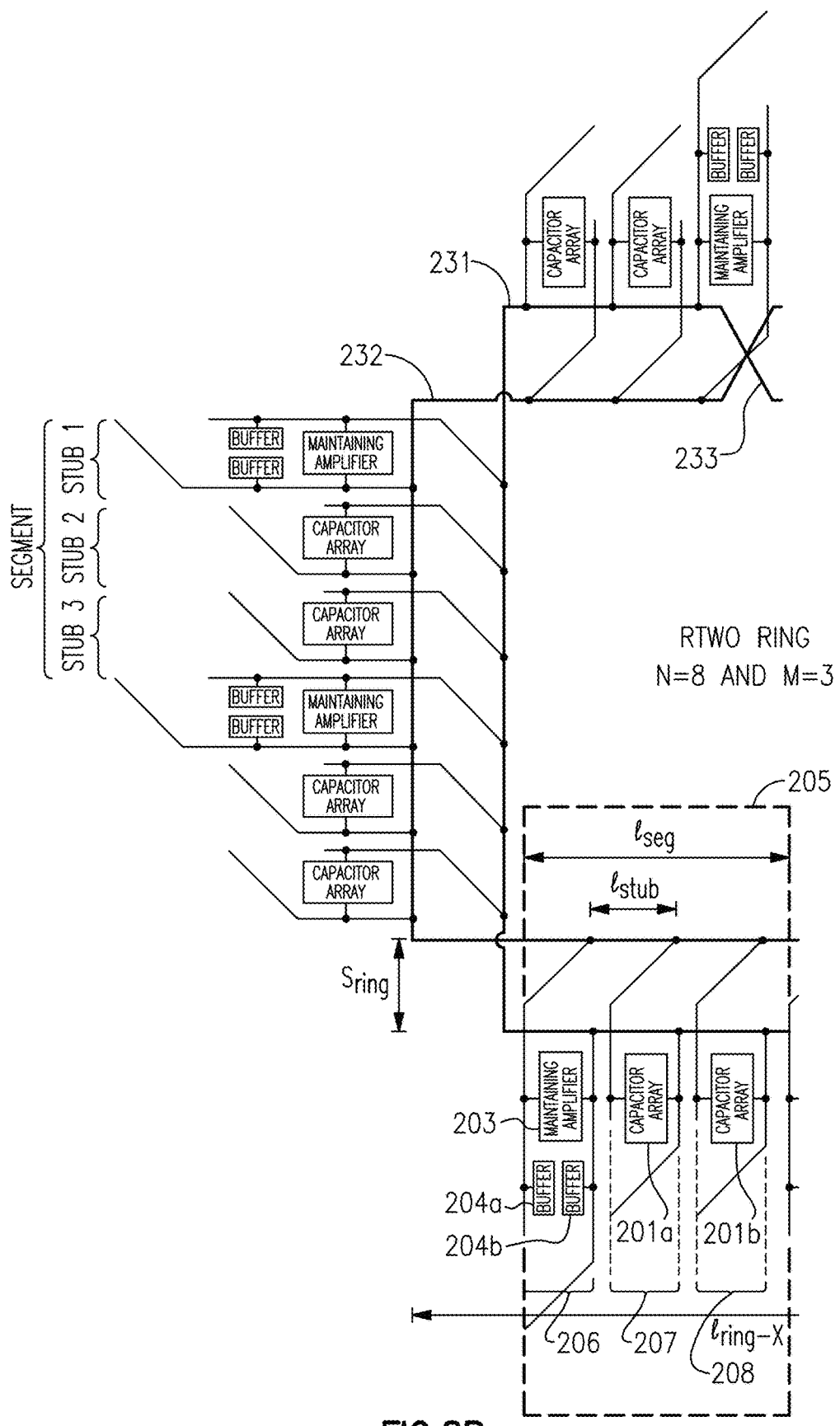
FIG. 8B is a schematic diagram of a first portion of the RTWO of FIG. 8A.
Figure 8C:
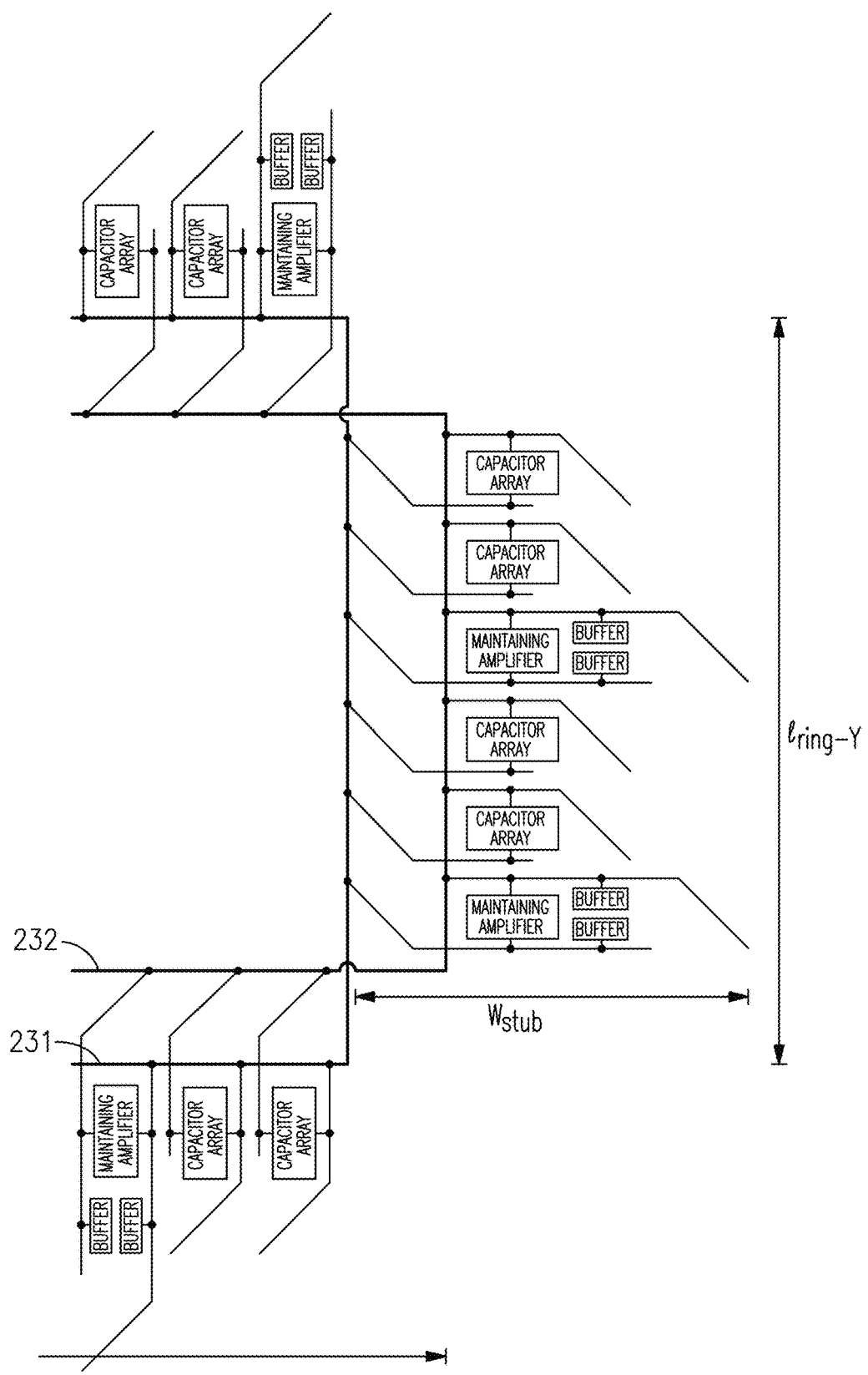
FIG. 8C is a schematic diagram of a second portion of the RTWO of FIG. 8A.

FIG. 8A is a schematic diagram of another embodiment of an RTWO 200. FIG. 8B is a schematic diagram of a first portion of the RTWO 200 of FIG. 8A. FIG. 8C is a schematic diagram of a second portion of the RTWO 200 of FIG. 8A.

With reference to FIGS. 8A-8C, the RTWO 200 includes a differential transmission line including a first conductor 231 and a second conductor 232. As shown in FIG. 8A, the differential transmission line (231, 232) is connected in a closed-loop or ring, and the differential transmission line includes a crossover 233 to provide inversion to a traveling wave propagating around the ring. Additionally, in the illustrated embodiment, the RTWO's differential transmission line is connected in a closed-loop and is folded at each of four corners. However, the RTWO's differential transmission line can be implemented in other ways, including, for example, different implementations of folding and/or routing of the conductors 231 and 232. For instance, the teachings herein are applicable not only to RTWOs implemented using rectangular or square loops, but also to RTWOs including transmission lines shaped in other ways. Thus, although the illustrated RTWO 200 includes four sides, the teachings herein are applicable to RTWOs including more or fewer sides.

The RTWO 200 of FIGS. 8A-8C further includes a plurality of segments (N=8, in this example), each implemented with three stubs. One stub of each segment includes a maintaining amplifier as well as a pair of buffers used to tap a differential clock signal that oscillates at the frequency of the RTWO and having a phase corresponding to that of the segment. Two other stubs of each segment include a portion of the tuning capacitance used to control the oscillation frequency of the RTWO 200.

For example, FIG. 8B depicts a segment 205 including a first stub 206, a second stub 207, and a third stub 208. The first stub 206 includes a first pair of stub conductors (with matched length for balancing) extending from the transmission line conductors 231, 232 and includes a maintaining amplifier 203 connected therebetween. An input of a first tap buffer 204a is connected to a first conductor of the first pair of stub conductors, while an input of a second tap buffer 204b is connected to a second conductor of the first pair of stub conductors. The difference between the output of the first tap buffer 204a and the output of the second tap buffer 204b corresponds to a differential clock signal associated with the segment 205.

The second stub 207 includes a second pair of stub conductors (with matched length for balancing) extending from transmission line conductors 231, 232 and including a first capacitor array 201a connected therebetween. Additionally, the third stub 208 includes a third pair of stub conductors extending from the transmission line conductors 231, 232 and including a second capacitor array 201b connected therebetween.

In the illustrated embodiment, the segments each have a length $l_{seg}$, and the distributed stubs are each separated by a length of transmission line $l_{stub}$, which can correspond to $l_{seg}/3$ in certain implementations. Each stub is associated with a pair of conductors extending from the differential transmission line and having width $W_{stub}$ from the innermost conductor of the differential transmission line 231, 232 to the outermost conductor of the stub. The RTWO ring has a length in the x-dimension $l_{ring-x}$ and a height in the y-dimension $l_{ring-y}$, and the conductors 231, 232 of the ring have a spacing $S_{ring}$. In one example, the RTWO ring has a length and height of 115 μm for a 30 GHz application, with N=8 segments each having three distributed stubs.

Figure 9:
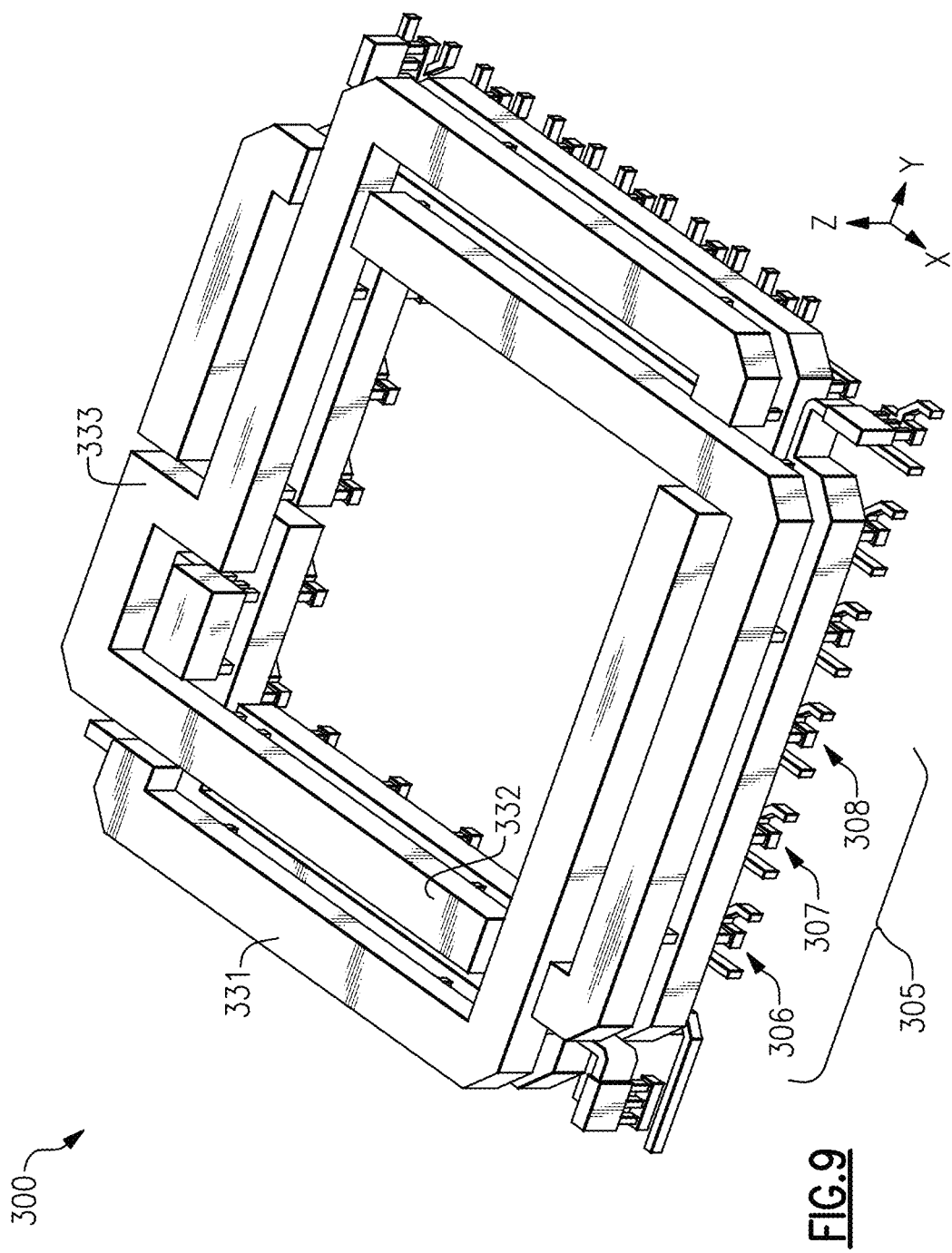
FIG. 9 is a perspective view of an RTWO ring layout according to one embodiment.

FIG. 9 is a perspective view of an RTWO ring layout 300 according to one embodiment. The RTWO ring layout 300 can be used, for example, to implement the RTWO 200 of FIGS. 8A-8C.

In the illustrated embodiment, The RTWO ring layout 300 includes a differential transmission line including a first conductor 331 and a second conductor 332. As shown in FIG. 9, the differential transmission line 331, 332 is connected in a closed-loop or ring, and the differential transmission line includes a crossover 333 to provide inversion to a traveling wave propagating around the ring. Additionally, in the illustrated embodiment, the RTWO's differential transmission line is connected in a closed-loop and is folded at each of four corners. However, the RTWO's differential transmission line can be implemented in other ways, including, for example, different implementations of folding and/or routing of the conductors 331, 332. For instance, the teachings herein are applicable not only to RTWOs implemented using rectangular or square loops, but also to RTWOs including transmission lines shaped in other ways. Thus, although the illustrated RTWO 300 includes four sides, the teachings herein are applicable to RTWOs including more or fewer sides.

The RTWO ring 300 of FIG. 9 further is divided into a plurality of segments (N=8, in this example), each implemented with three distributed stubs. For example, a segment 305 is depicted, and the segment 305 includes a first stub 306, a second stub 307, and a third stub 308. In certain implementations, the first stub 306, the second stub 307, and the third stub 308 are implemented in accordance with the first stub 206, the second stub 207, and the third stub 208, respectively, of FIGS. 8A-8C.

Figure 10:
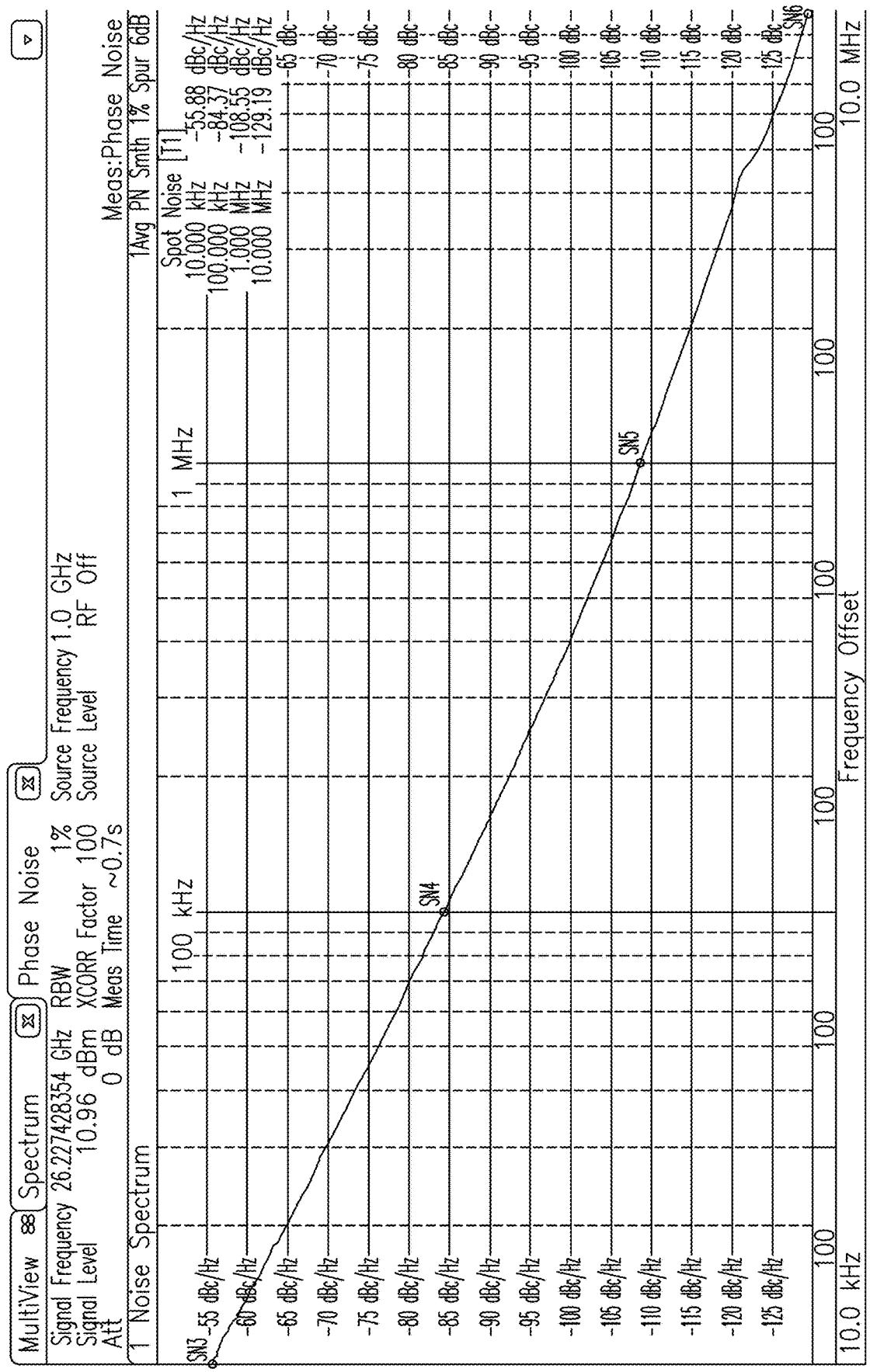
FIG. 10 is one example of a graph of measured phase noise for an RTWO operating at 26.2 Gigahertz (GHz).

FIG. 10 is one example of a graph of measured phase noise for an RTWO operating at 26.2 GHz.

Figure 11:
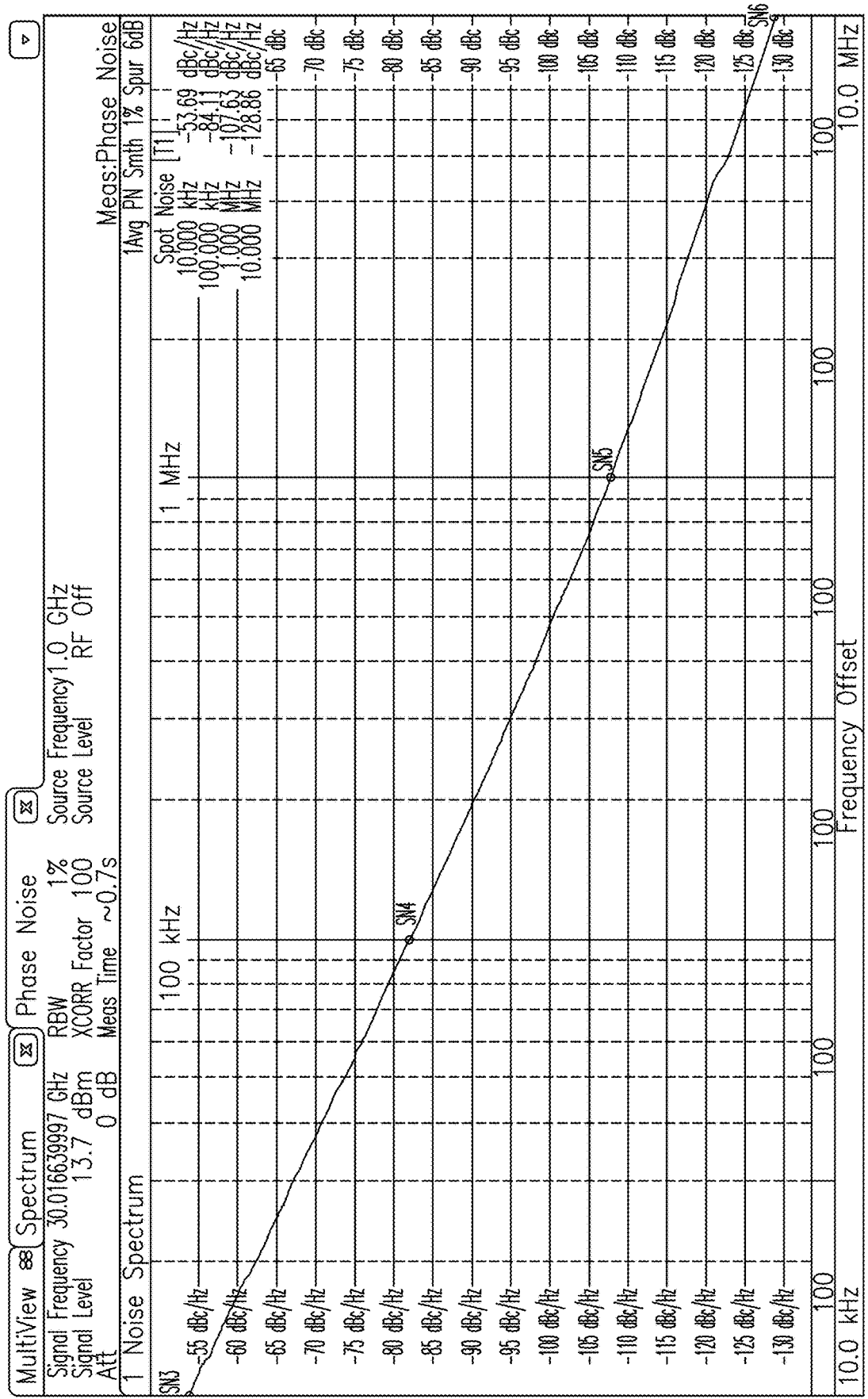
FIG. 11 is one example of a graph of measured phase noise for an RTWO operating at 30 GHz.

FIG. 11 is one example of a graph of measured phase noise for an RTWO operating at 30 GHz.

Applications

Devices employing the above described schemes can be implemented into various electronic devices. Examples of electronic devices include, but are not limited to, RF communication systems, consumer electronic products, electronic test equipment, communication infrastructure, radar systems, etc.

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

What is claimed is:

1. A rotary traveling wave oscillator (RTWO) with low flicker phase noise, the RTWO comprising:
    a differential transmission line connected as a ring having an odd number of crossovers, the differential transmission line configured to carry a traveling wave; and
    a plurality of segments positioned around the ring, each of the plurality of segments comprising two or more stubs configured to compensate for a dispersion of the differential transmission line, wherein the two or more stubs comprises a first stub including a first pair of conductors connected to the differential transmission line and a maintaining amplifier connected between the first pair of conductors, and wherein the two or more stubs further comprises a second stub including a second pair of conductors connected to the differential transmission line and a first controllable capacitor connected between the second pair of conductors.

2. The RTWO of claim 1, wherein the two or more stubs comprises a third stub including a third pair of conductors connected to the differential transmission line and a second controllable capacitor connected between the third pair of conductors.

3. The RTWO of claim 2, wherein first controllable capacitor includes a first portion of a capacitor array, and wherein the second controllable capacitor includes a second portion of the capacitor array.

4. The RTWO of claim 2, wherein a first distance between the first stub and the second stub is substantially equal to a second distance between the second stub and the third stub.

5. The RTWO of claim 1, wherein the differential transmission line includes a first transmission line conductor and a second transmission line conductor, wherein the first pair of conductors includes a first conductor connected to the first transmission line conductor and a second conductor connected to the second transmission line conductor, wherein the first conductor and the second conductor have equal length.

6. The RTWO of claim 1, wherein the first stub further includes a first tap buffer connected to a first conductor of the first pair of conductors, and a second tap buffer connected to a second conductor of the first pair of conductors.

7. The RTWO of claim 1, wherein the first controllable capacitor includes a coarse-tuning capacitor array and a fine-tuning capacitor array.

8. The RTWO of claim 7, further comprising a segment decoder configured to control the coarse-tuning capacitor array and the fine-tuning capacitor array.

9. The RTWO of claim 1, wherein a distance between the first stub and the second stub induces a first phase shift to cancel a second phase shift arising from the dispersion of the differential transmission line.

10. The RTWO of claim 1, wherein the plurality of segments is evenly distributed around the ring.

11. A method of oscillation in a rotary traveling wave oscillator (RTWO), the method comprising:
    propagating a traveling wave along a differential transmission line connected as a ring having an odd number of crossovers;
    controlling a capacitance of the differential transmission line using a plurality of segments positioned around the ring;
    maintaining energy of the traveling wave using the plurality of segments; and
    compensating for a dispersion of the differential transmission line using two or more stubs of each of the plurality of segments, the two or more stubs comprising a first stub including a first pair of conductors connected to the differential transmission line and a maintaining amplifier connected between the first pair of conductors, and a second stub including a second pair of conductors connected to the differential transmission line and a first controllable capacitor connected between the second pair of conductors.

12. The method of claim 11, wherein the two or more stubs comprises a third stub including a third pair of conductors connected to the differential transmission line and a second controllable capacitor connected between the third pair of conductors, wherein controlling the capacitance of the differential transmission line includes controlling a capacitance of the first controllable capacitor and controlling a capacitance of the second controllable capacitor.

13. The method of claim 12, wherein controlling the capacitance of the first controllable capacitor includes adjusting a setting of a capacitor array.

14. The method of claim 11, further comprising using the two or more stubs to induce a first phase shift that cancels a second phase shift arising from the dispersion of the differential transmission line.

15. A rotary traveling wave oscillator (RTWO) with low flicker phase noise, the RTWO comprising:
    a differential transmission line connected as a ring having an odd number of crossovers, the differential transmission line configured to carry a traveling wave; and
    a plurality of segments positioned around the ring, wherein the plurality of segments are each configured to provide energy to the traveling wave and to control an oscillation frequency of the RTWO, wherein each of the segments comprises two or more stubs that are distributed to compensate for a dispersion of the differential transmission line, wherein each of the two or more stubs comprises a pair of conductors extending from the differential transmission line.

16. The RTWO of claim 15, wherein the two or more stubs includes a first stub and a second stub separated by a distance that induces a first phase shift to cancel a second phase shift arising from the dispersion of the differential transmission line.

17. The RTWO of claim 15, wherein the two or more stubs includes a first stub and a second stub, each of the segments comprising a maintaining amplifier connected to the first stub and a capacitor array connected to the second stub.

18. The RTWO of claim 17, wherein each of the segments further comprises a first tap buffer and a second tap buffer connected to the first stub.

19. The RTWO of claim 17, wherein the capacitor array is partitioned into a fine capacitor array and a coarse capacitor array.

20. The RTWO of claim 15, wherein the two or more stubs includes a first stub, a second stub, and a third stub, each of the segments comprising a maintaining amplifier connected to the first stub, a first capacitor array connected to the second stub, and a second capacitor array connected to the third stub.

* * * * *